(12) United States Patent
Pyo et al.

(10) Patent No.: US 12,490,391 B2
(45) Date of Patent: Dec. 2, 2025

(54) DISPLAY DEVICE

(71) Applicant: LG ELECTRONICS INC., Seoul (KR)

(72) Inventors: Jonggil Pyo, Seoul (KR); Kwaneun Jin, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 232 days.

(21) Appl. No.: 18/036,147

(22) PCT Filed: Nov. 10, 2020

(86) PCT No.: PCT/KR2020/015704
§ 371 (c)(1),
(2) Date: May 9, 2023

(87) PCT Pub. No.: WO2022/102799
PCT Pub. Date: May 19, 2022

(65) Prior Publication Data
US 2023/0422415 A1  Dec. 28, 2023

(51) Int. Cl.
*H05K 5/02* (2006.01)
*H02K 7/116* (2006.01)

(52) U.S. Cl.
CPC ........... *H05K 5/0217* (2013.01); *H02K 7/116* (2013.01)

(58) Field of Classification Search
CPC .... H05K 5/0217; H02K 7/116; F16M 11/046; F16M 11/18; G09F 9/30
See application file for complete search history.

(56) References Cited

U.S. PATENT DOCUMENTS

| | | | |
|---|---|---|---|
| 7,458,546 B2* | 12/2008 | Jang | F16M 11/105 248/404 |
| 9,880,456 B1* | 1/2018 | Yellin | G03B 21/58 |
| 2006/0017356 A1* | 1/2006 | Hoss | A47B 81/06 312/319.7 |

(Continued)

FOREIGN PATENT DOCUMENTS

| | | |
|---|---|---|
| KR | 100495216 | 6/2005 |
| KR | 1020100123009 | 11/2010 |

(Continued)

OTHER PUBLICATIONS

Machine translation of KR 20150031525 (Year: 2025).*

(Continued)

*Primary Examiner* — Sagar Shrestha
(74) *Attorney, Agent, or Firm* — LEE, HONG, DEGERMAN, KANG & WAIMEY

(57) ABSTRACT

A display device is disclosed. The display device of the present disclosure includes: a display panel; a frame to which the display panel is mounted; a cover assembly movably coupled to the frame and including a cover disposed at a front of the display panel; and a lift assembly mounted to the frame and moving the cover assembly, wherein the lift assembly includes: a motor providing rotational force; a pinion connected to a rotating shaft of the motor; and a rack engaged with the pinion and extending in a moving direction of the cover assembly, wherein the cover assembly includes a bracket coupled to the rack at a rear of the display panel.

15 Claims, 25 Drawing Sheets

(56) References Cited

U.S. PATENT DOCUMENTS

| | | | |
|---|---|---|---|
| 2009/0225239 A1* | 9/2009 | Osada | H04R 1/028 |
| | | | 348/841 |
| 2011/0089304 A1* | 4/2011 | Fenelon | F16M 11/18 |
| | | | 248/404 |
| 2011/0304781 A1 | 12/2011 | Rowell | |
| 2021/0392765 A1* | 12/2021 | Pyo | H05K 5/0217 |
| 2023/0019173 A1* | 1/2023 | Park | F16M 11/18 |
| 2023/0422417 A1* | 12/2023 | Pyo | F16M 11/04 |

FOREIGN PATENT DOCUMENTS

| | | |
|---|---|---|
| KR | 1020150031525 | 3/2015 |
| KR | 1020200114337 | 10/2020 |

OTHER PUBLICATIONS

Machine translation of KR 20100123009 (Year: 2025).*
PCT International Application No. PCT/KR2020/015704, International Search Report dated Aug. 6, 2021, 4 pages.

* cited by examiner

[FIG. 1]
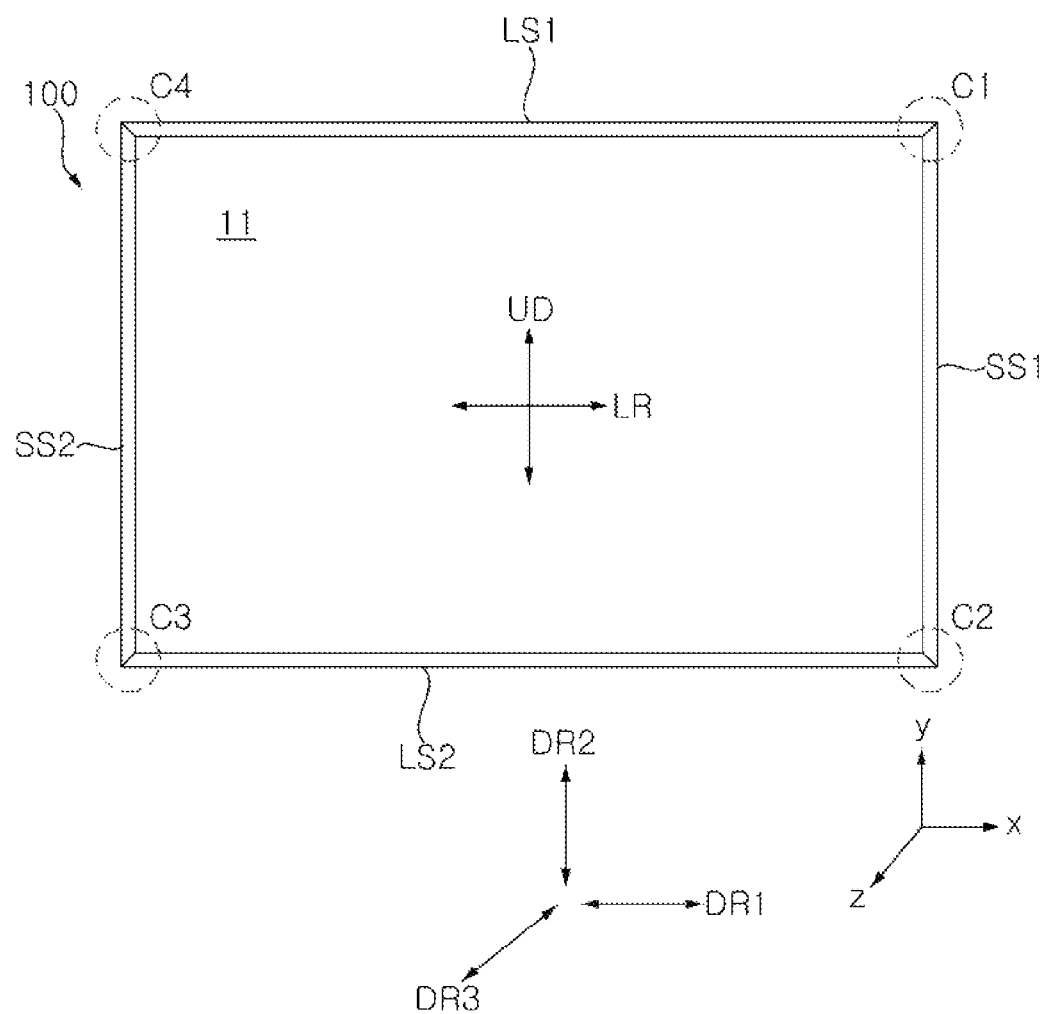

[FIG. 2]
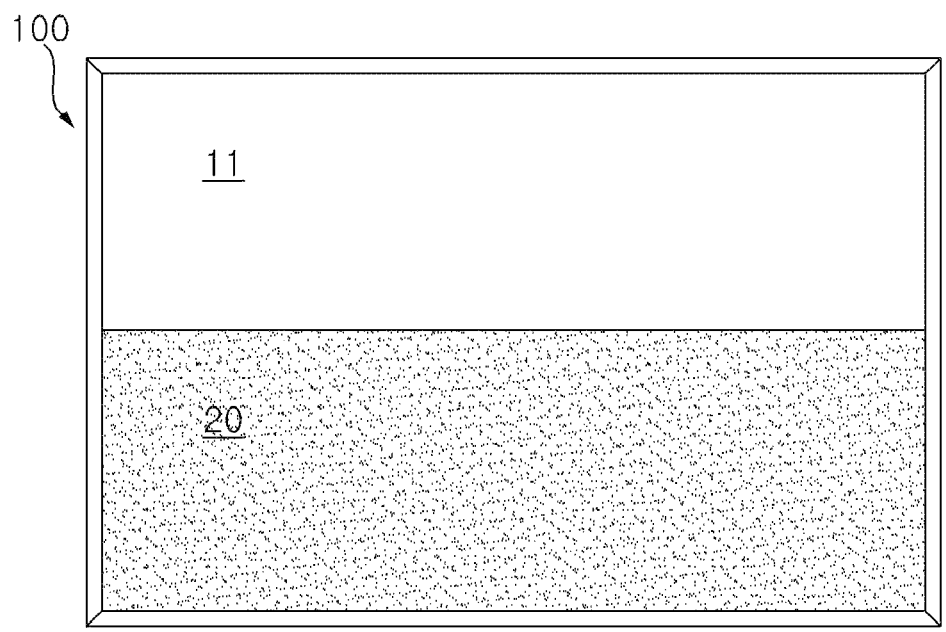
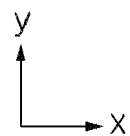

[FIG. 3]
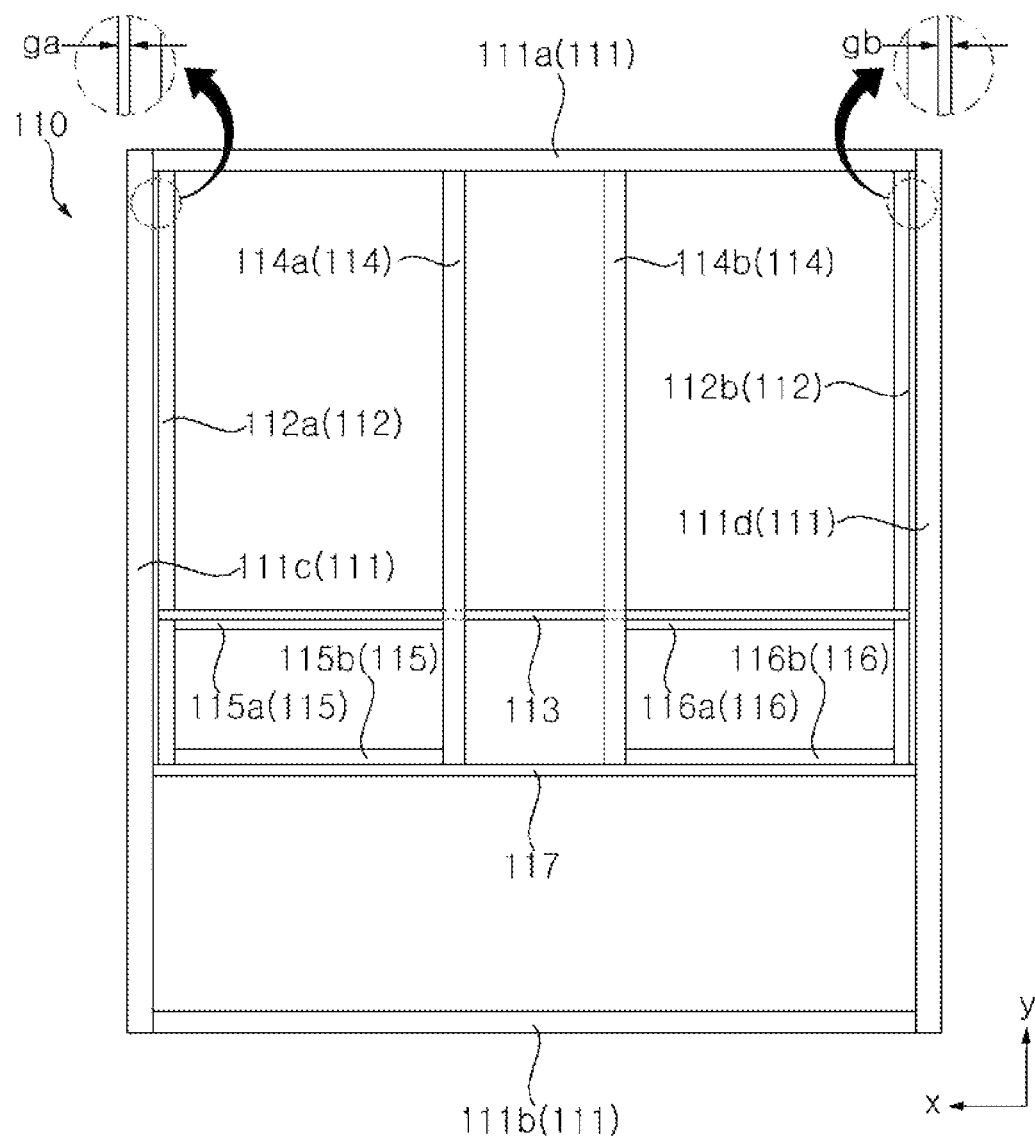

[FIG. 4]
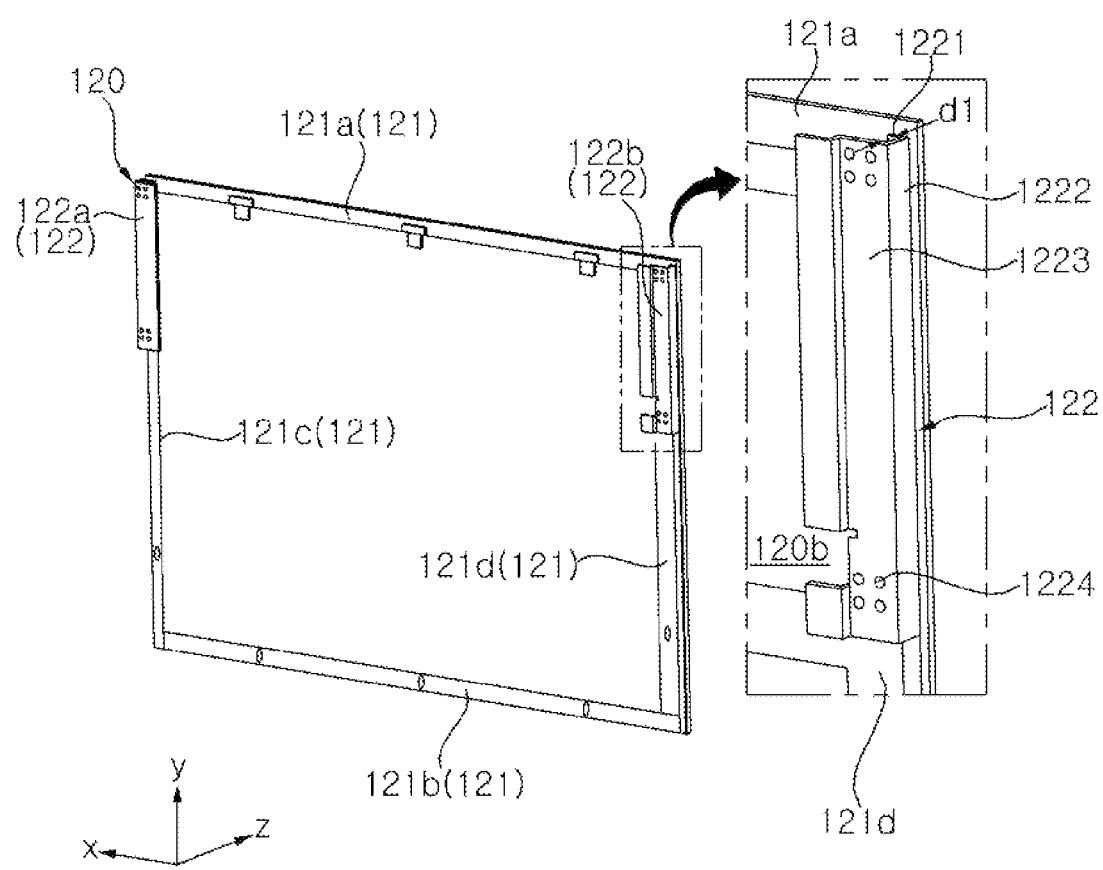

[FIG. 5]
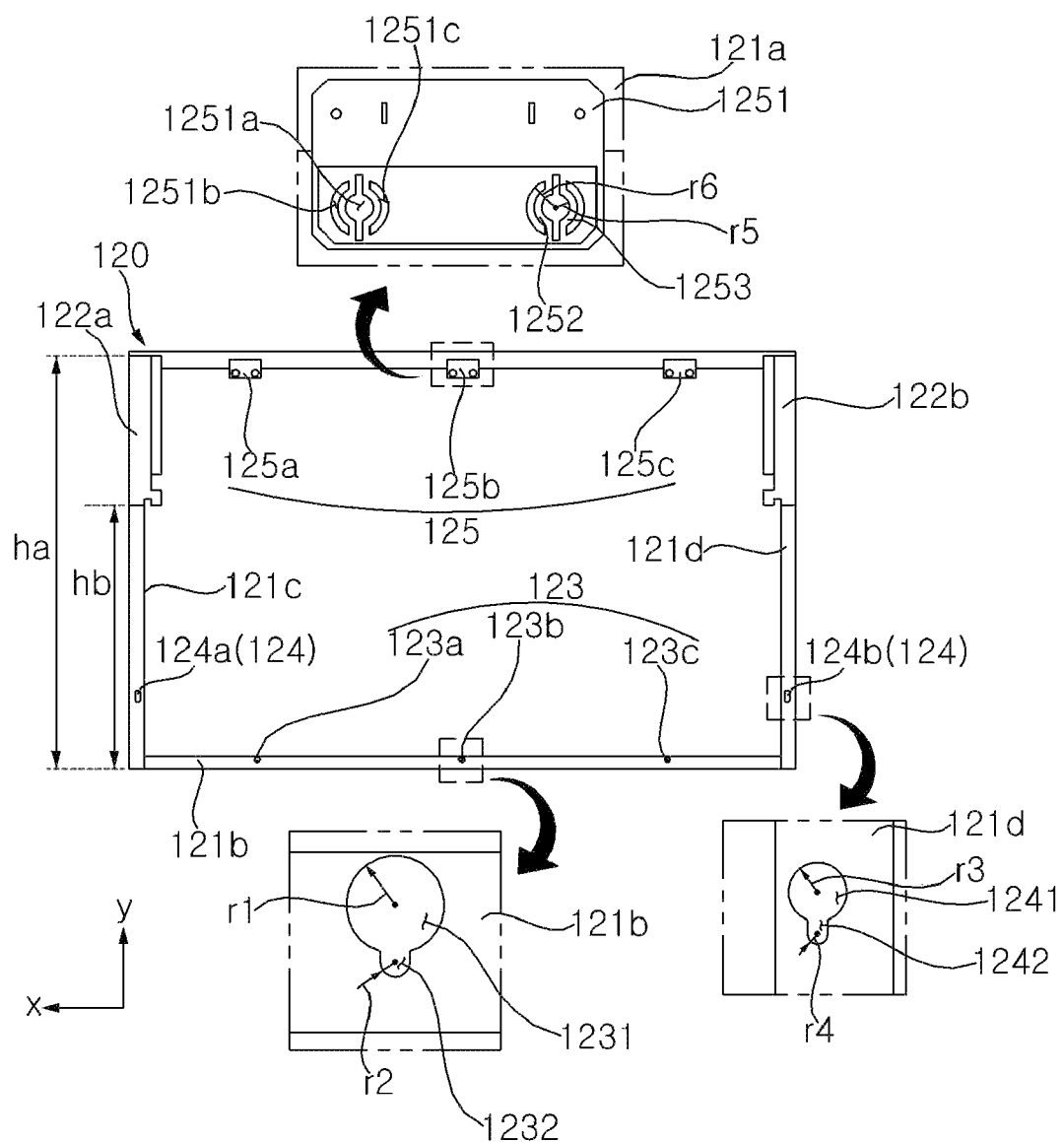

[FIG. 6]
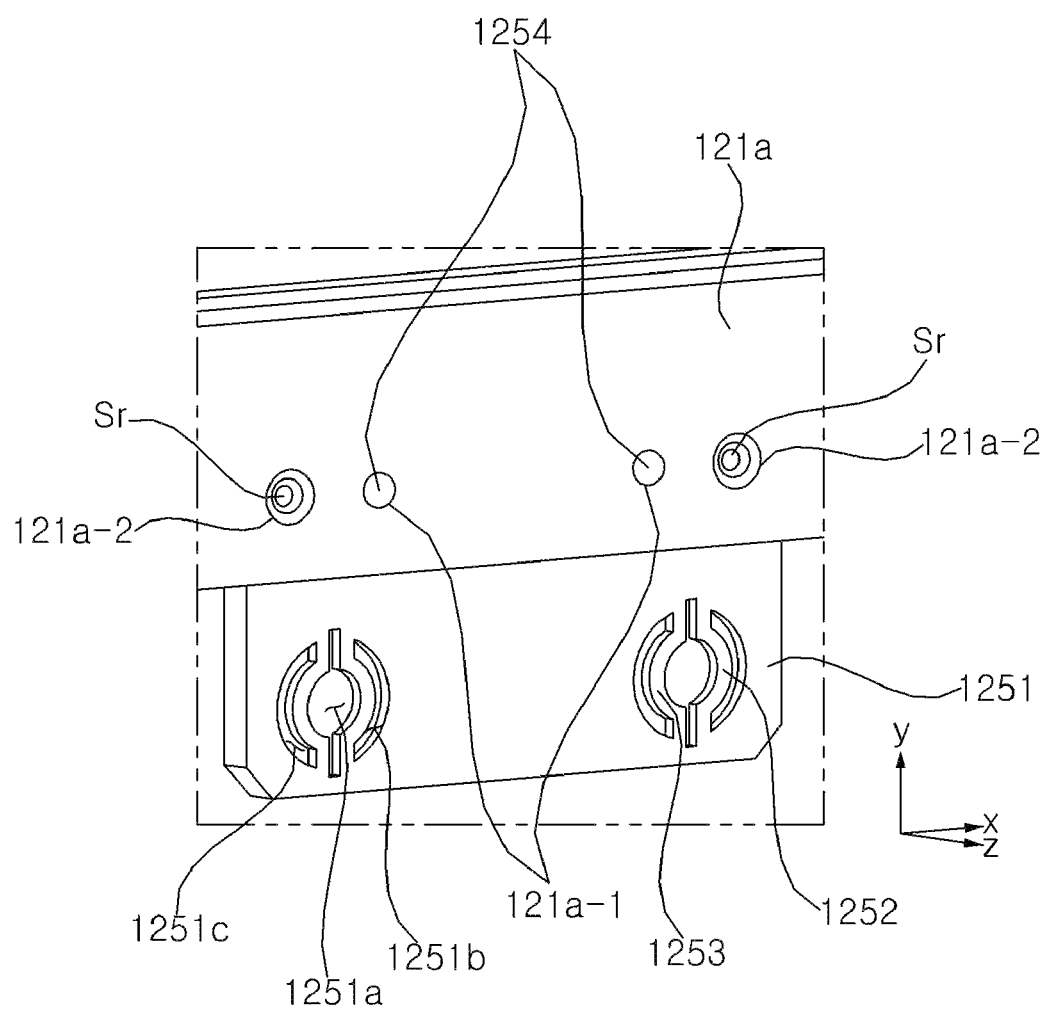

[FIG. 7]
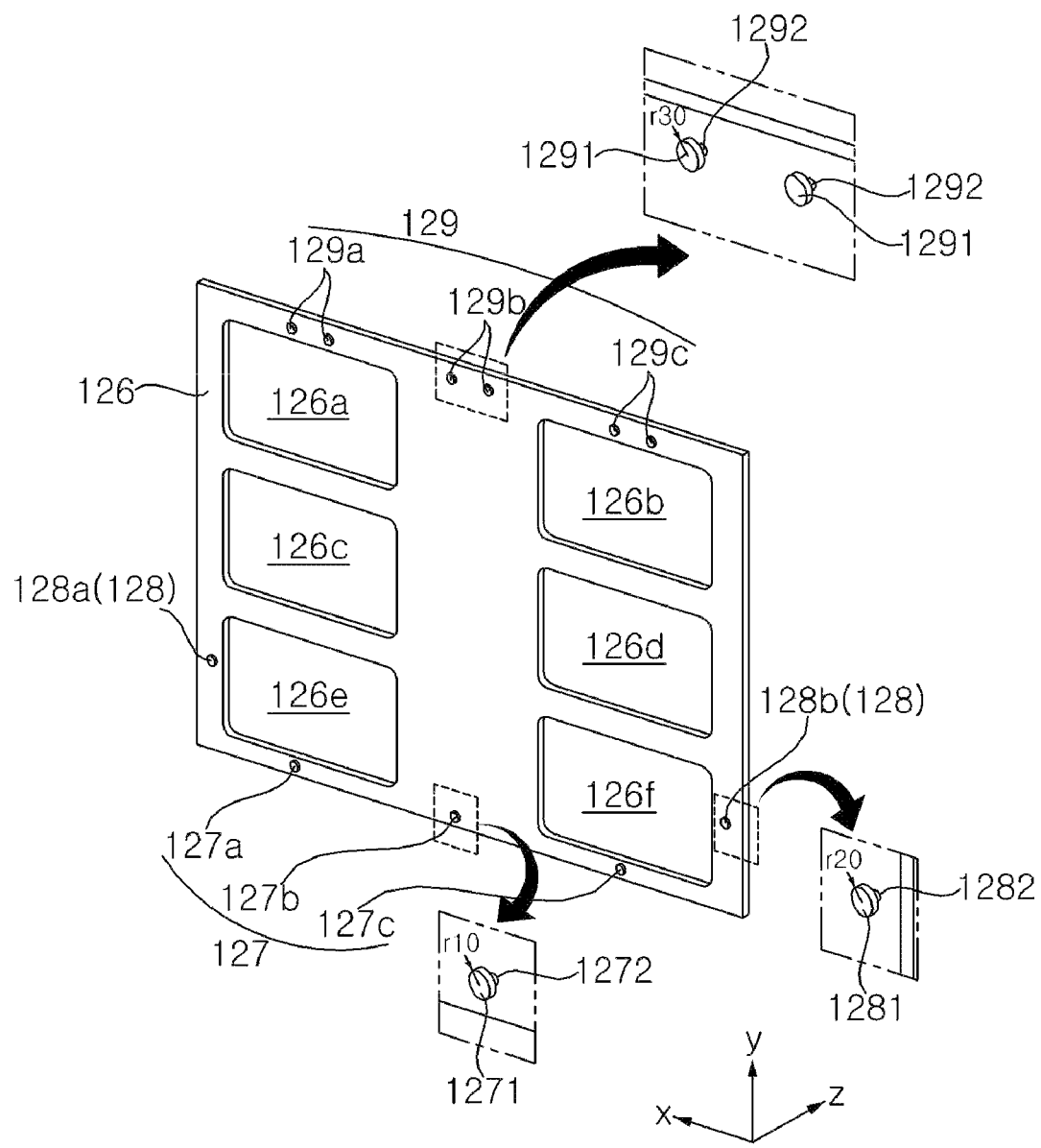

[FIG. 8]
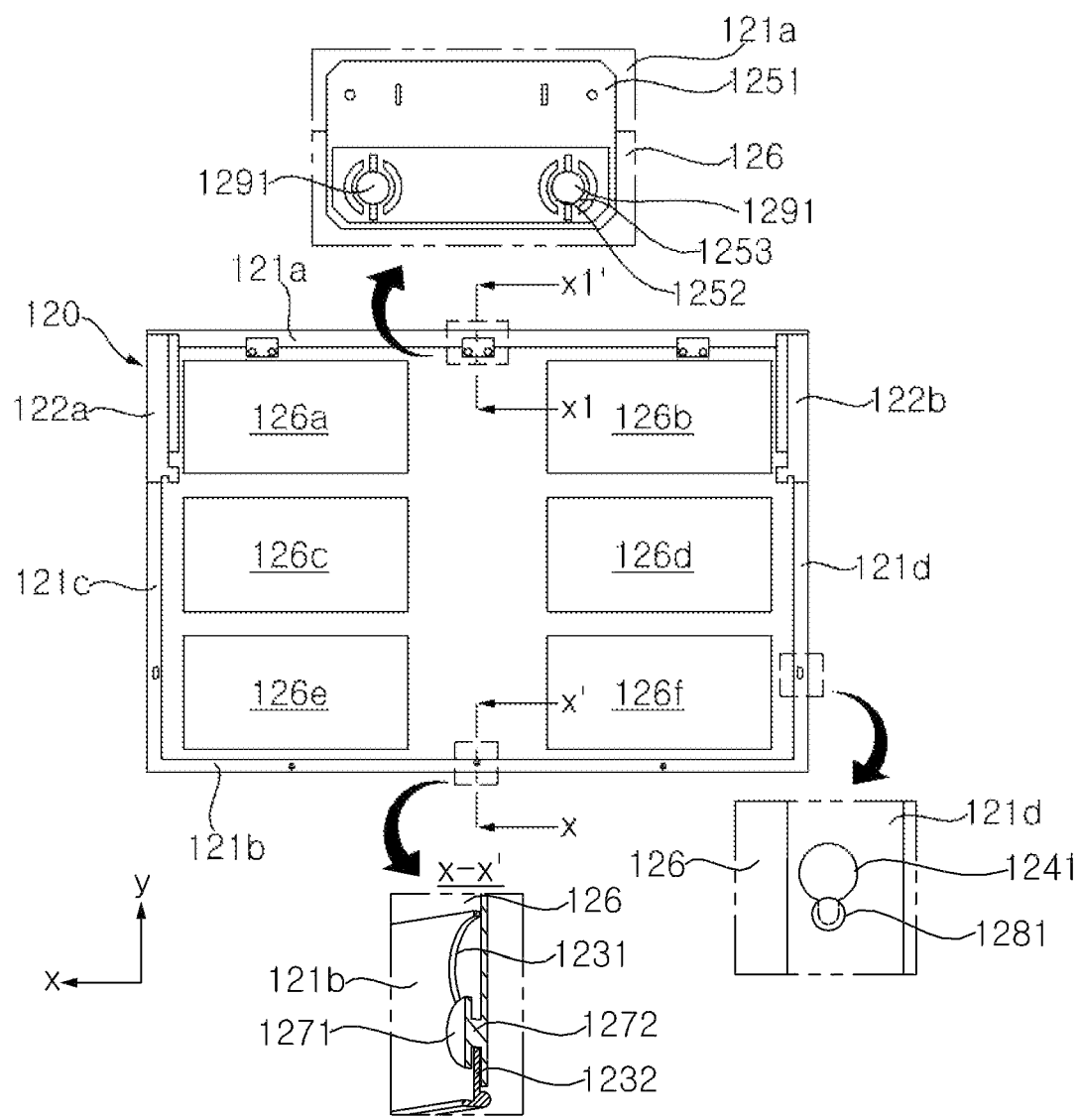

[FIG. 9]
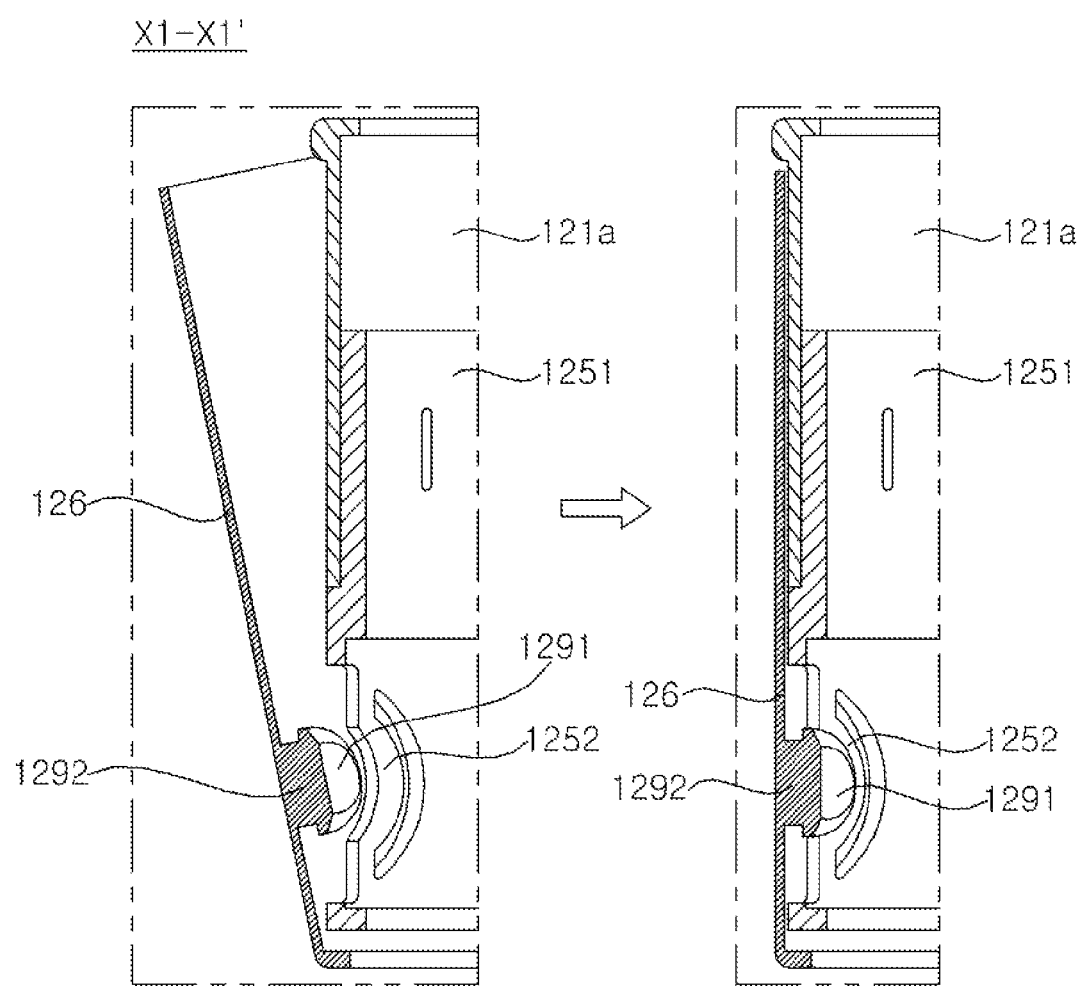

[FIG. 10]
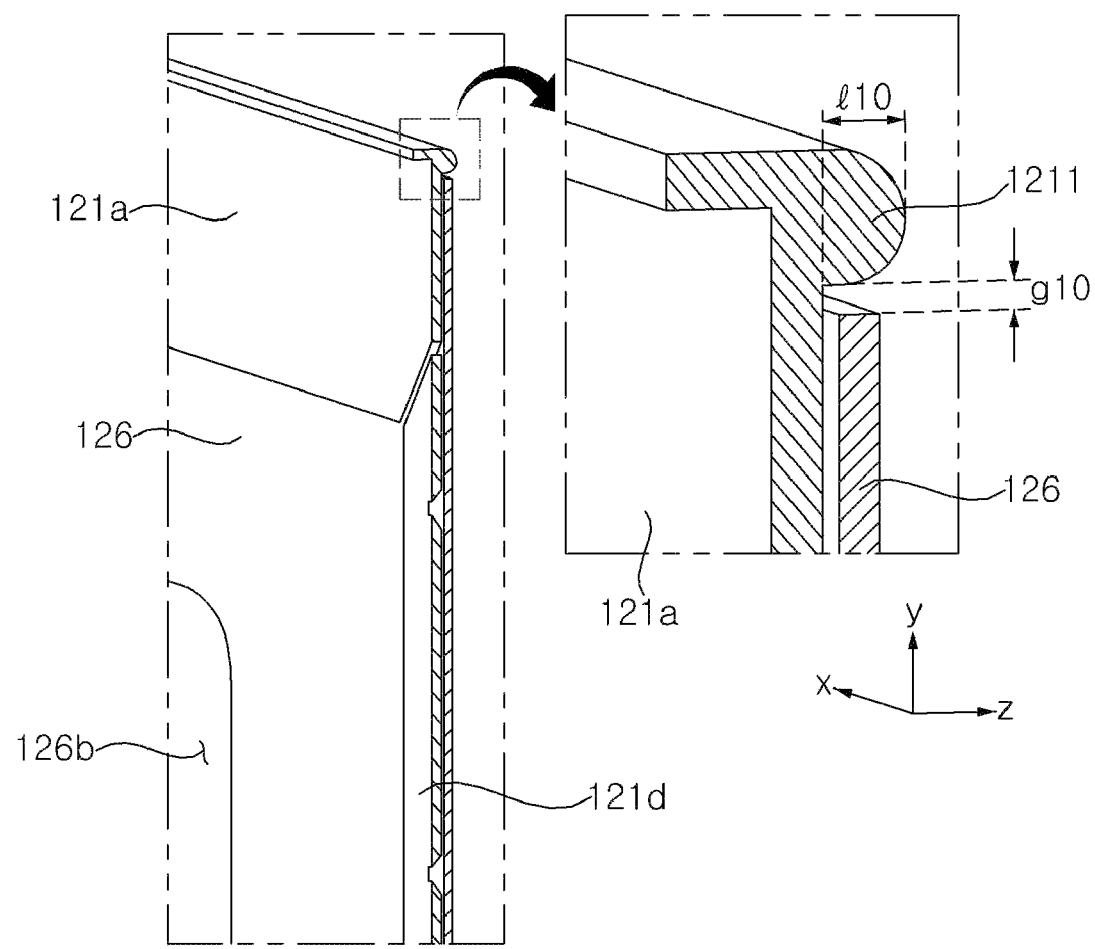

[FIG. 11]
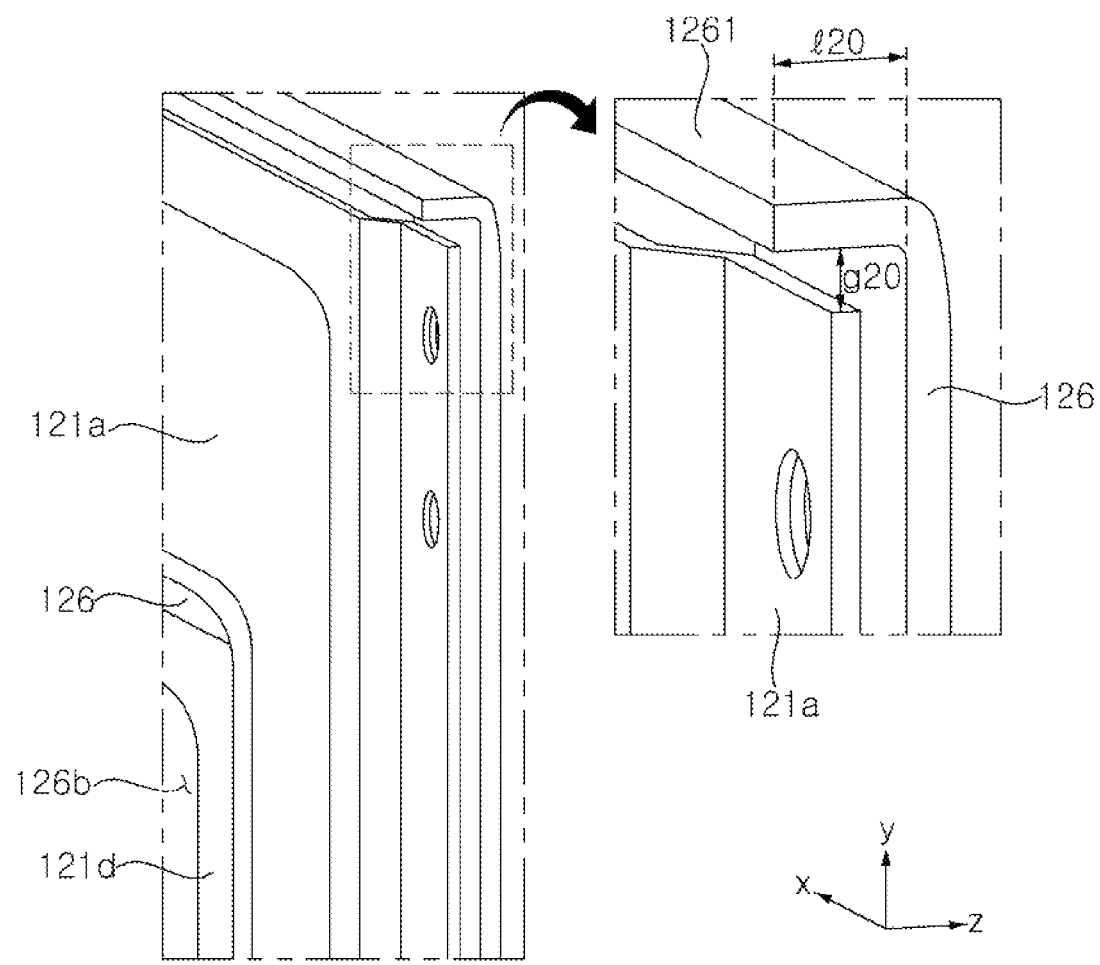

[FIG. 12]
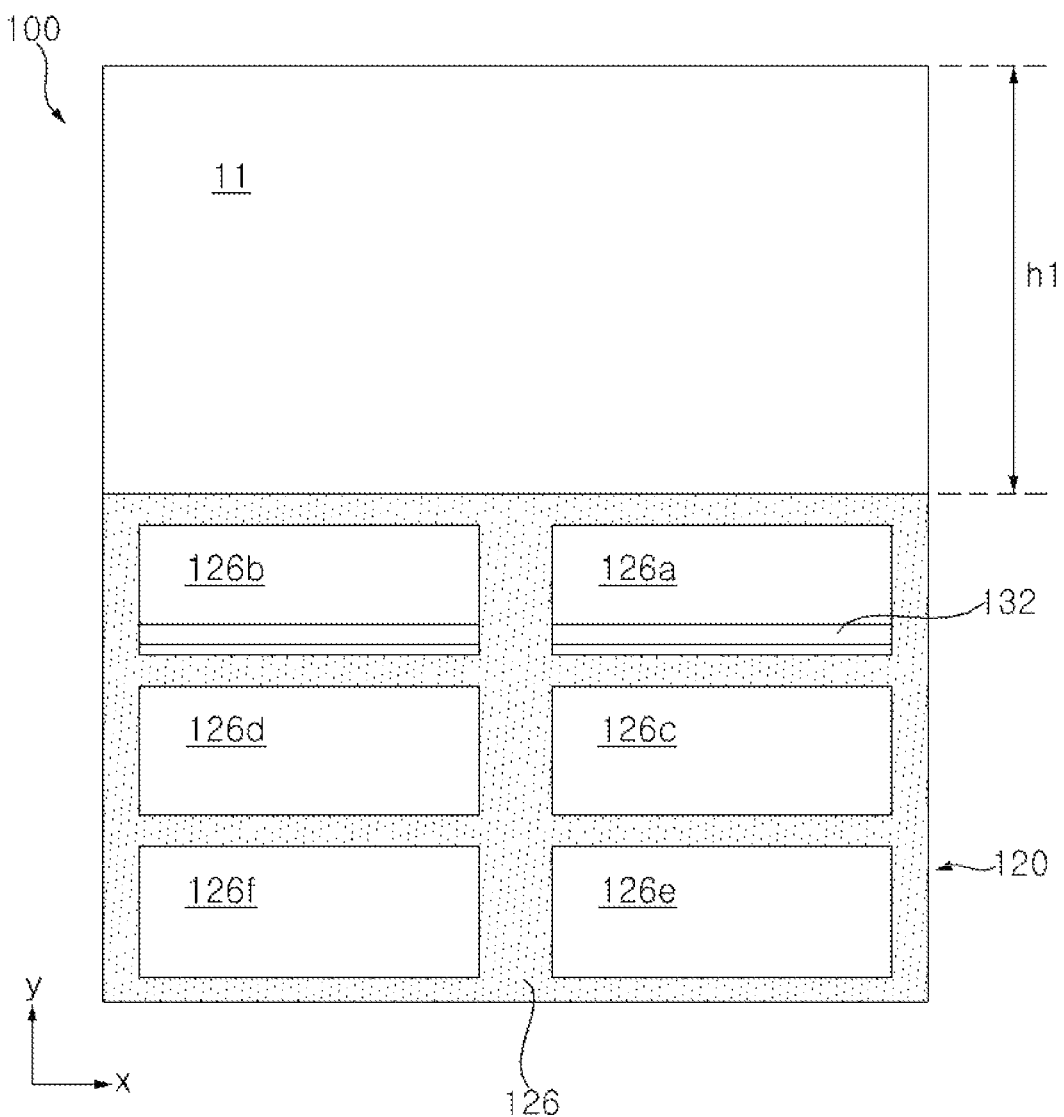

[FIG. 13]
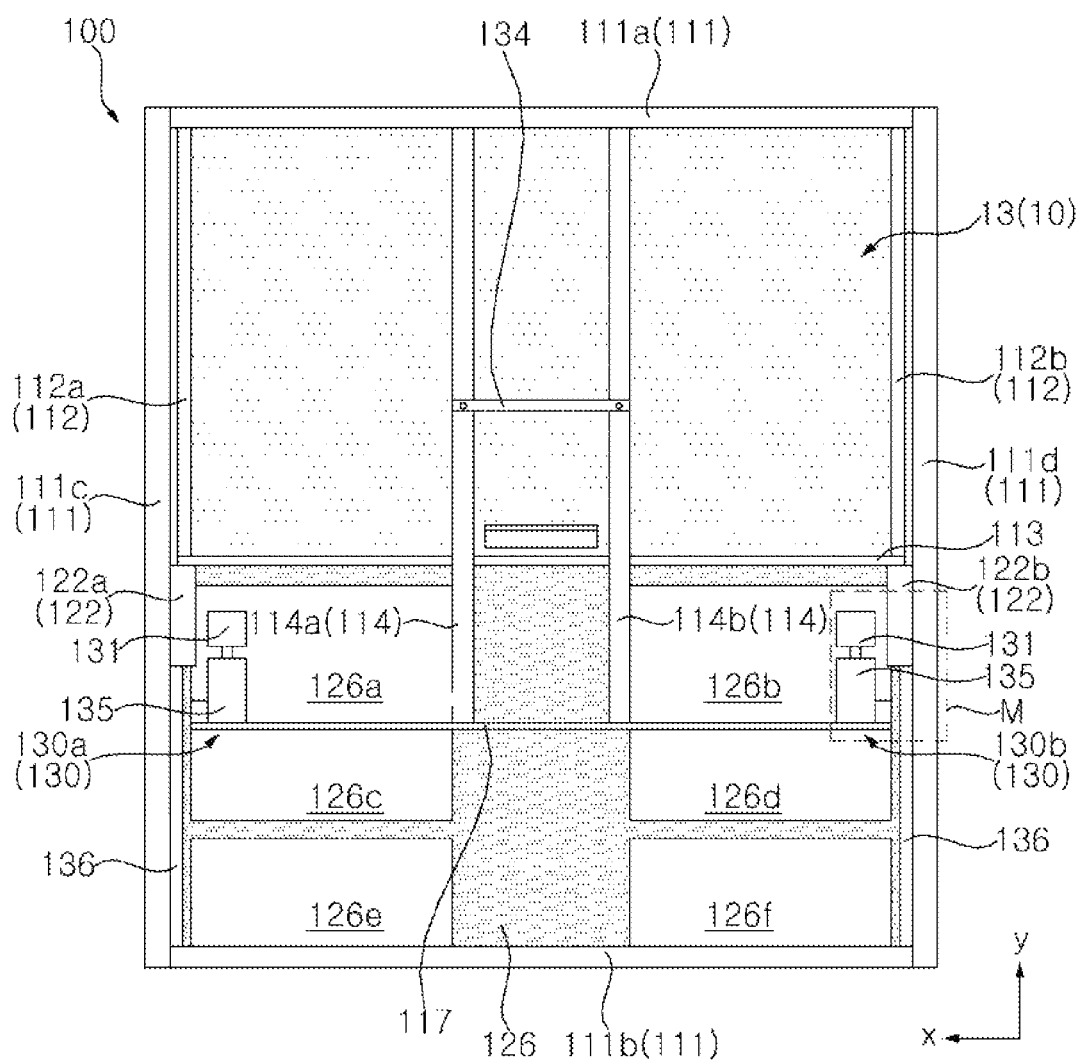

[FIG. 14]
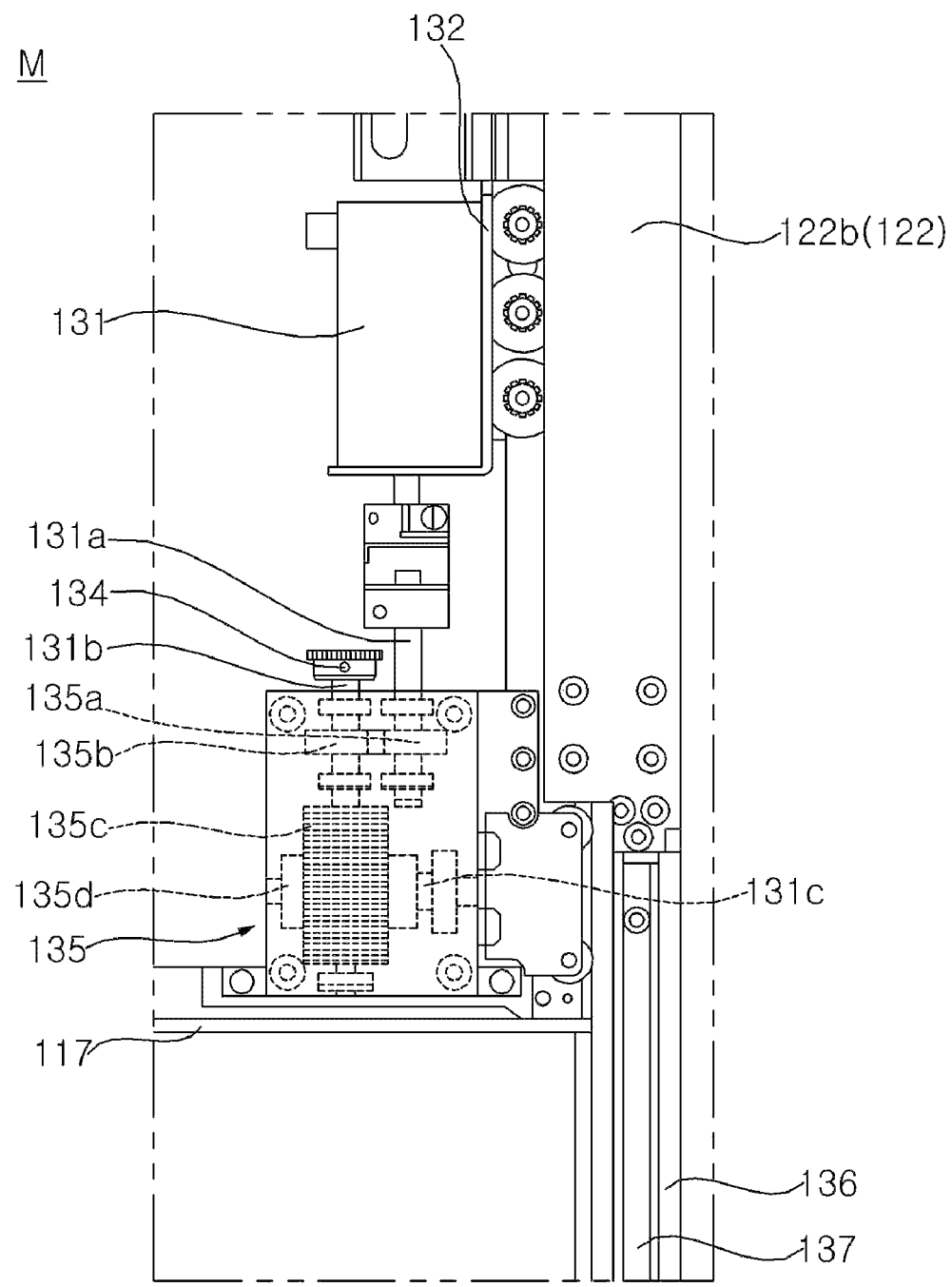

[FIG. 15]
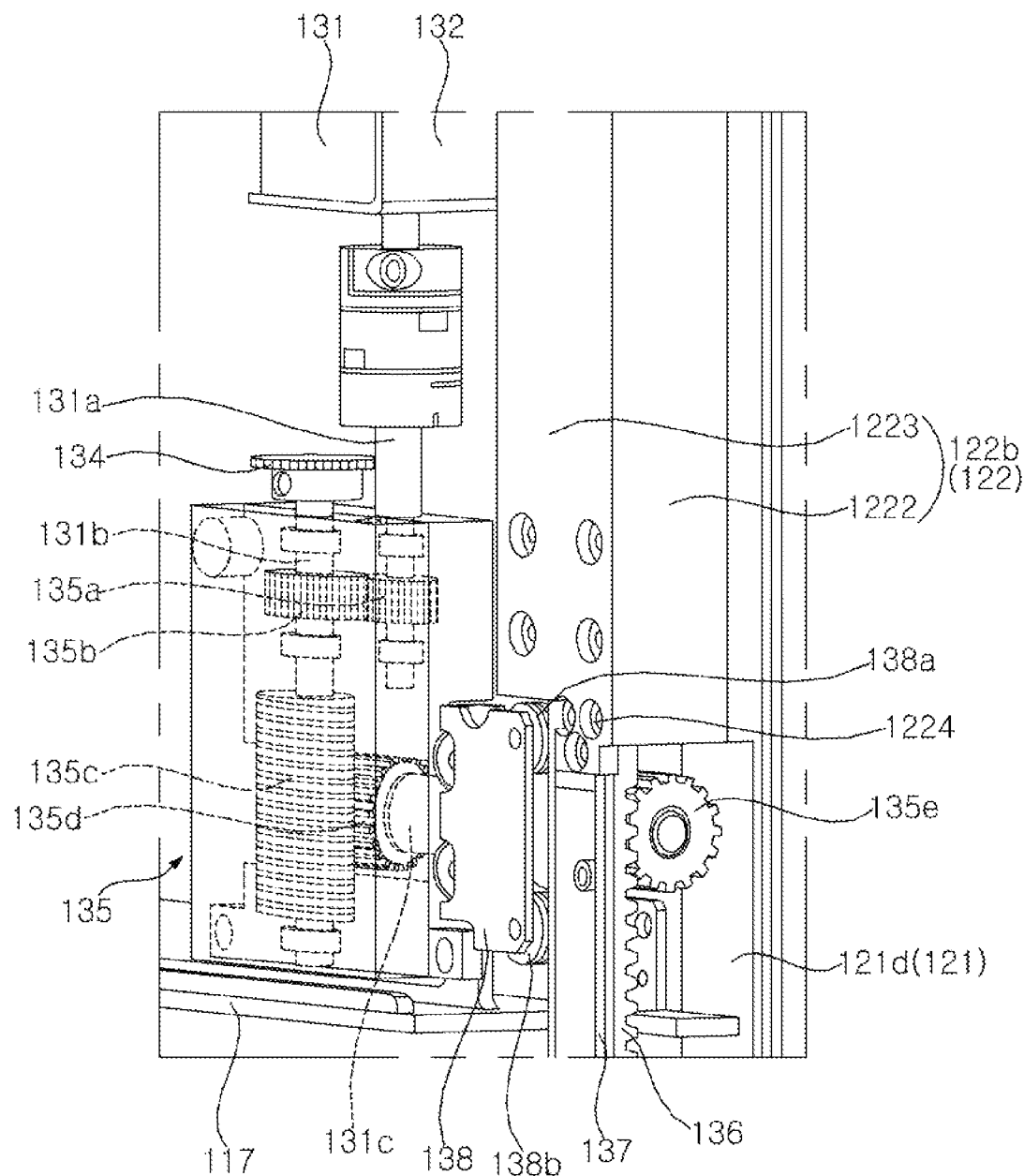

[FIG. 16]
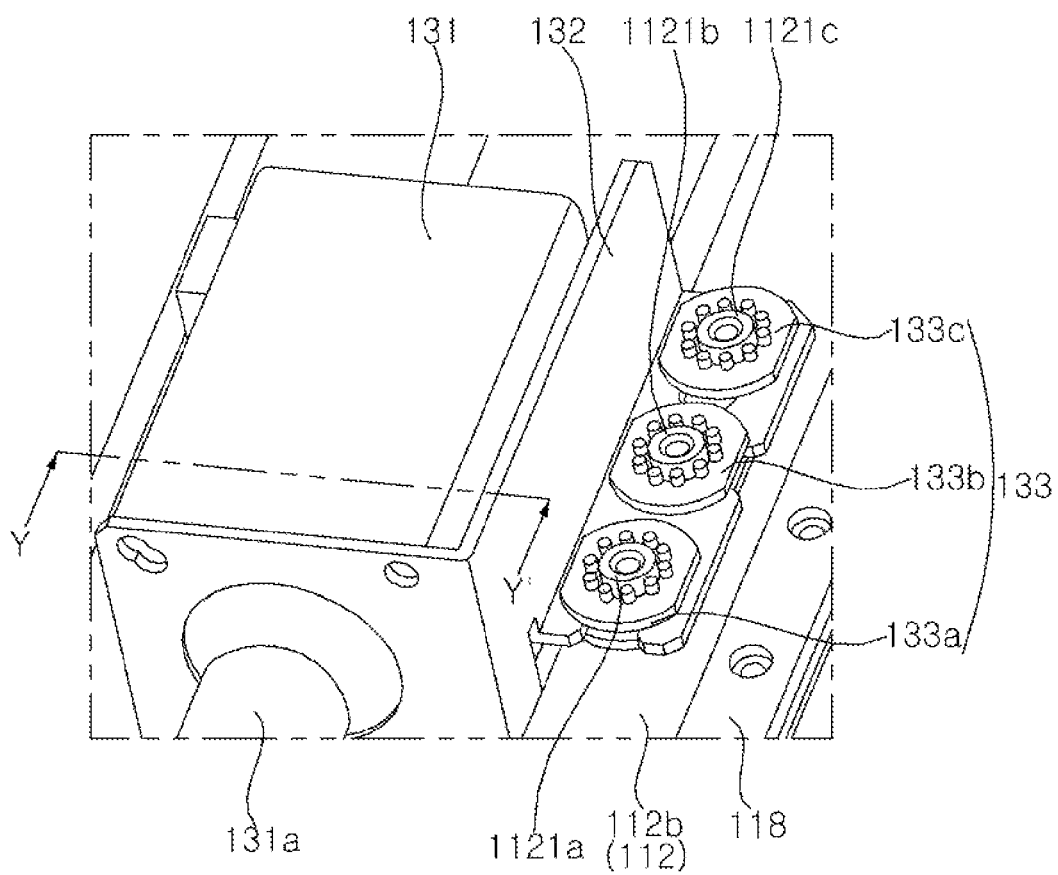

[FIG. 17]
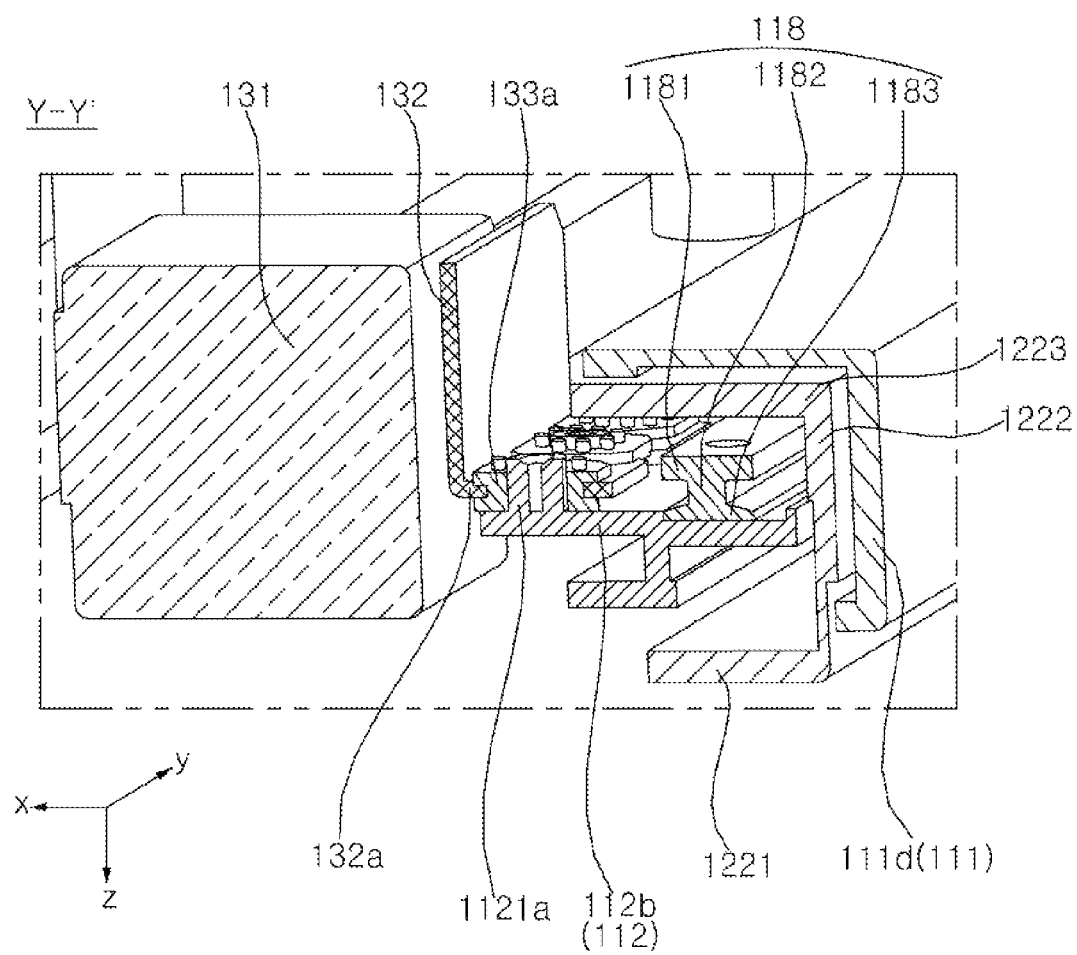

[FIG. 18]
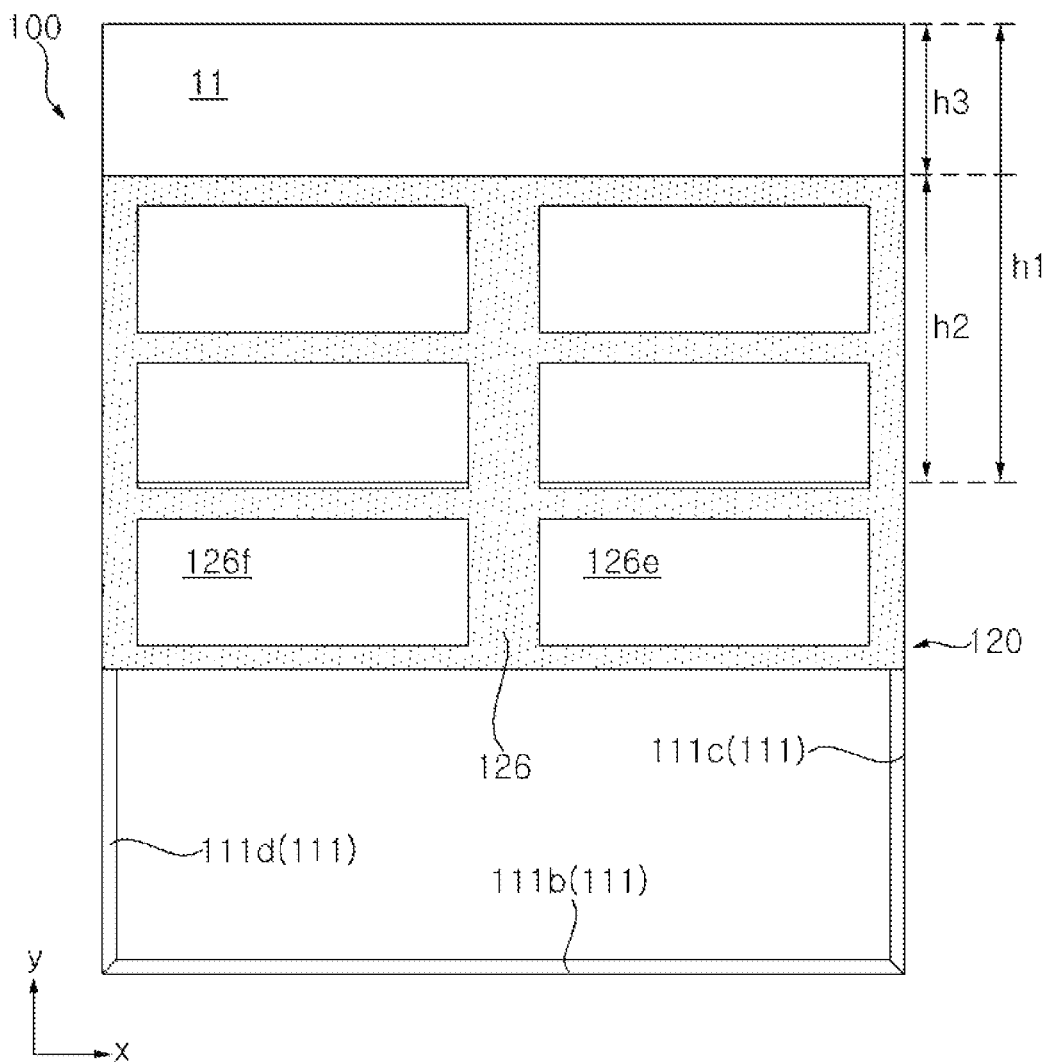

[FIG. 19]
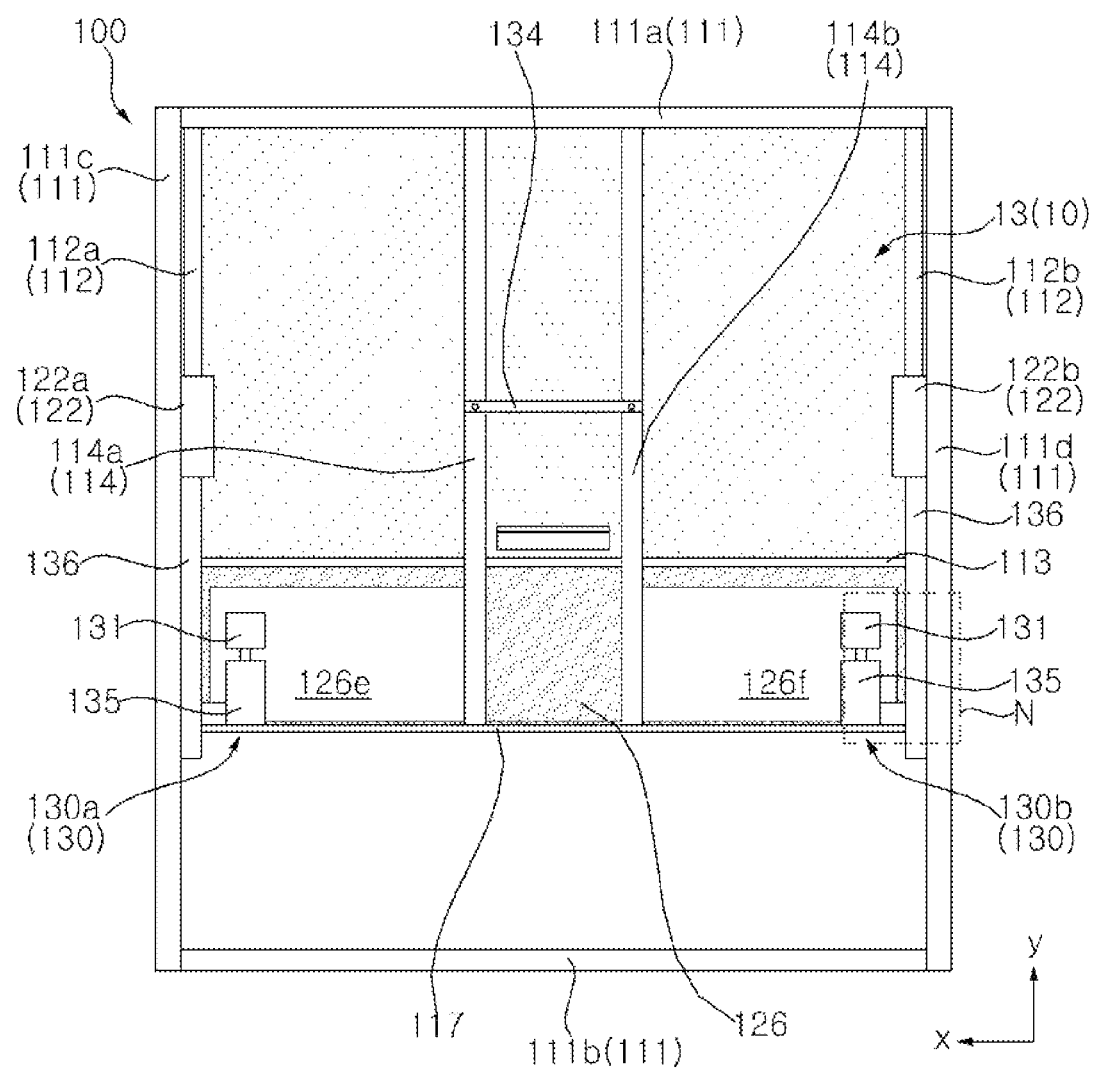

[FIG. 20]
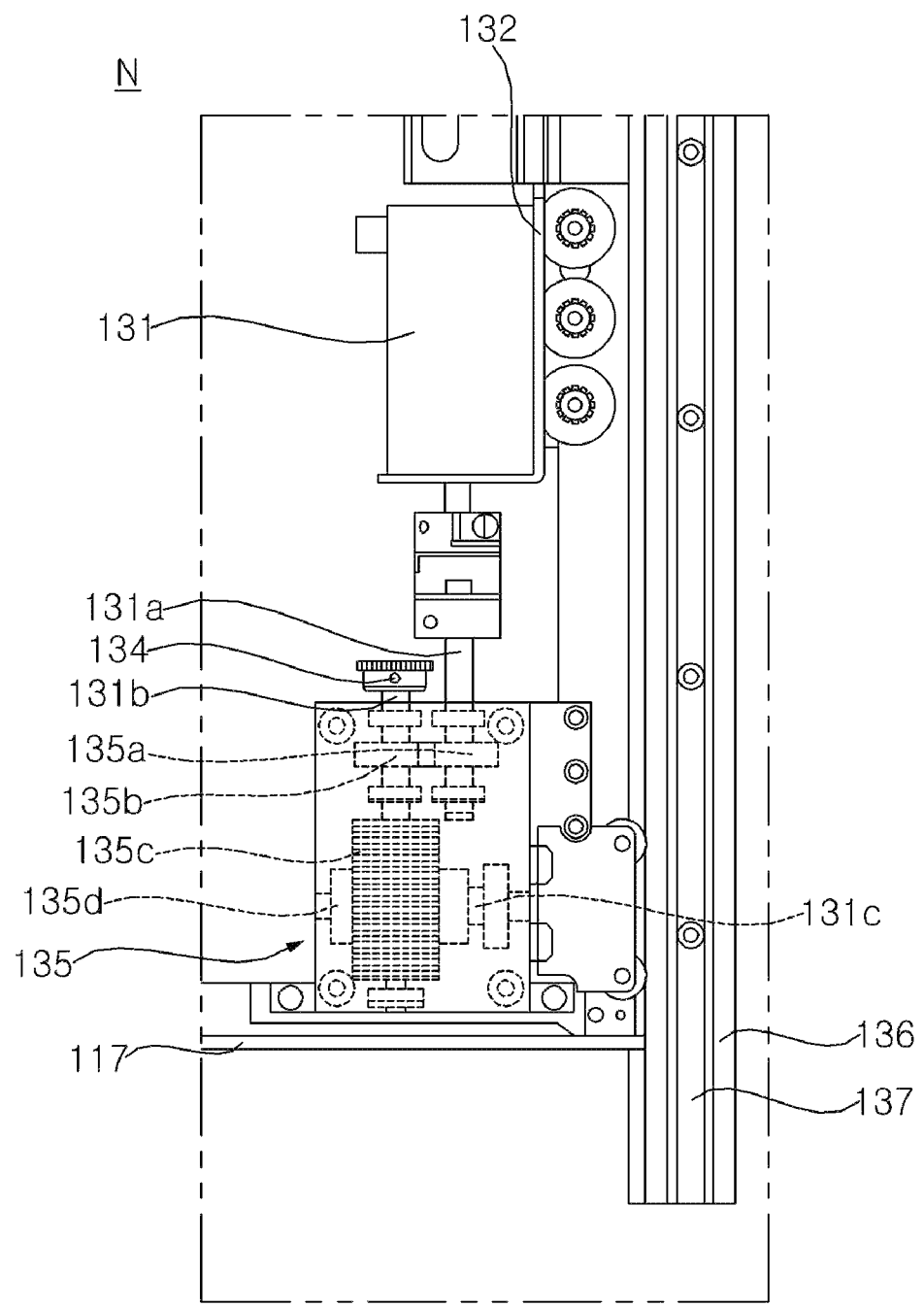

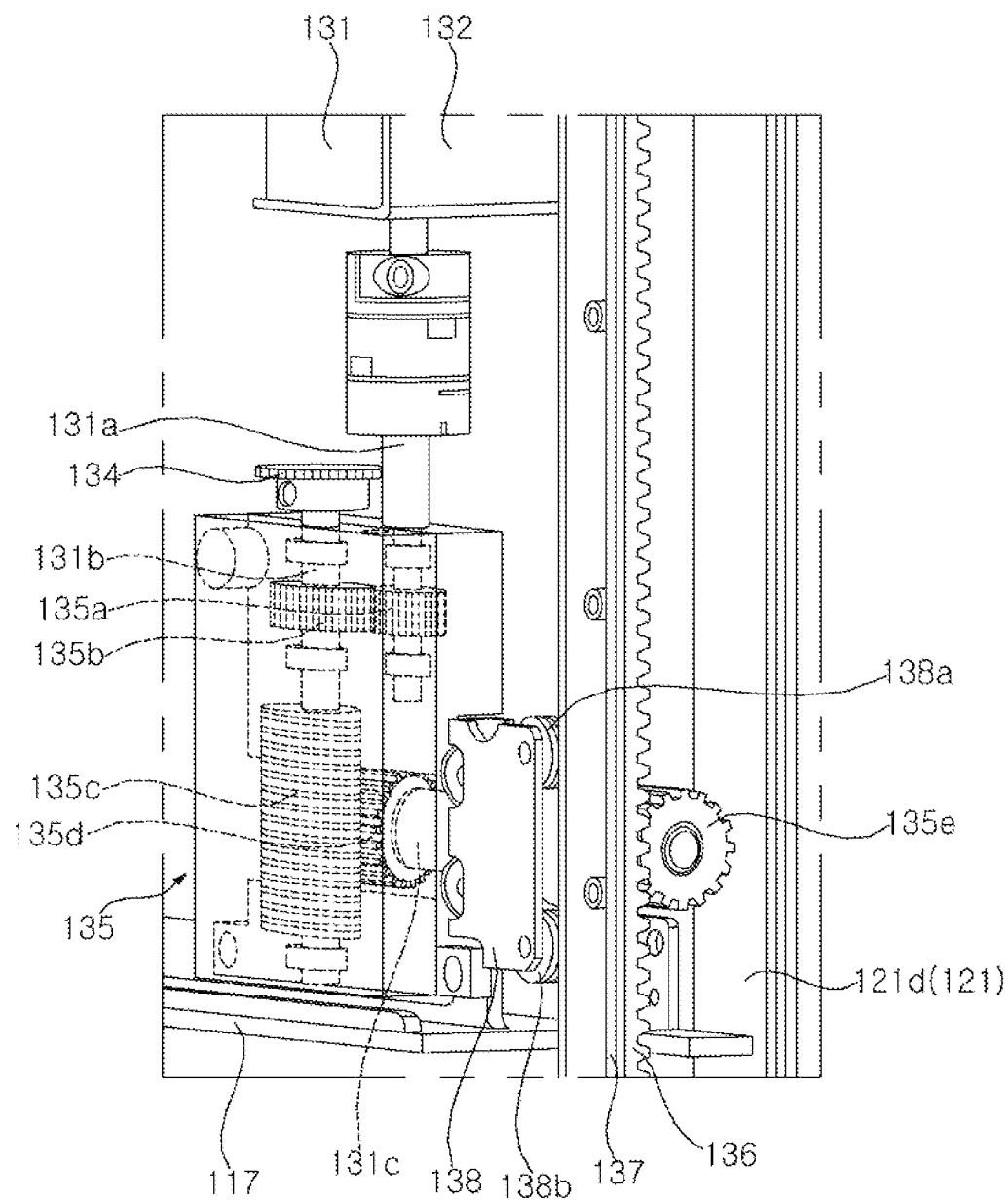
[FIG. 21]

[FIG. 22]
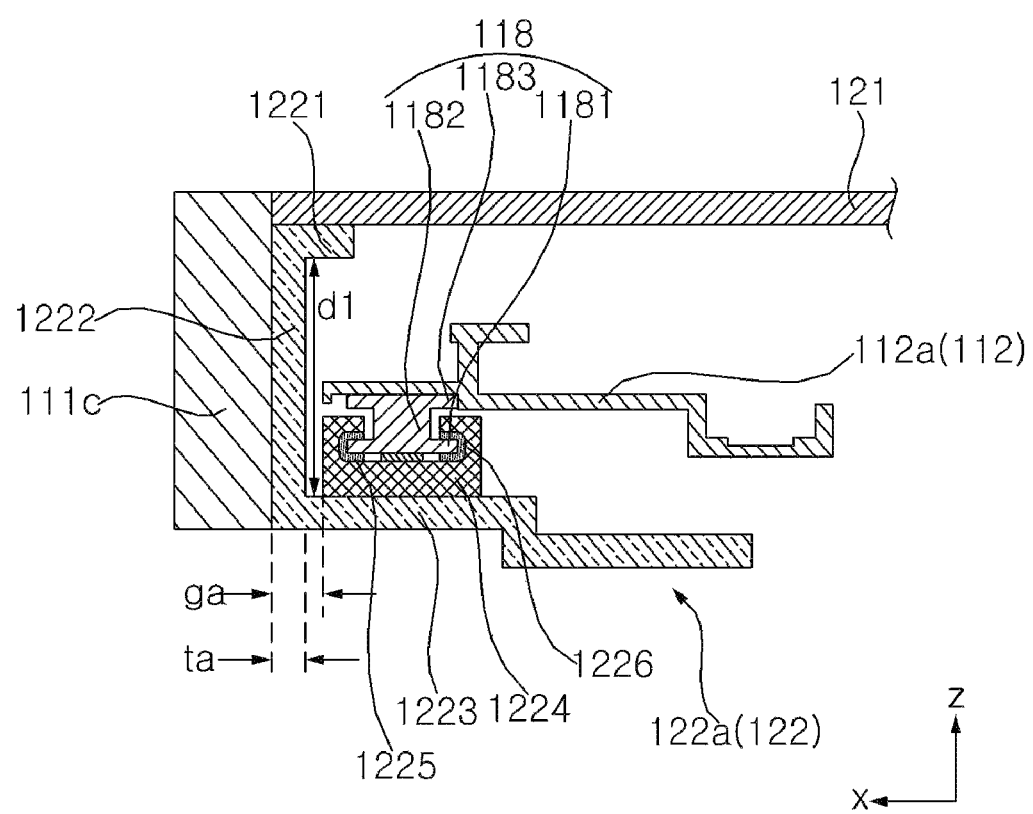

[FIG. 23]
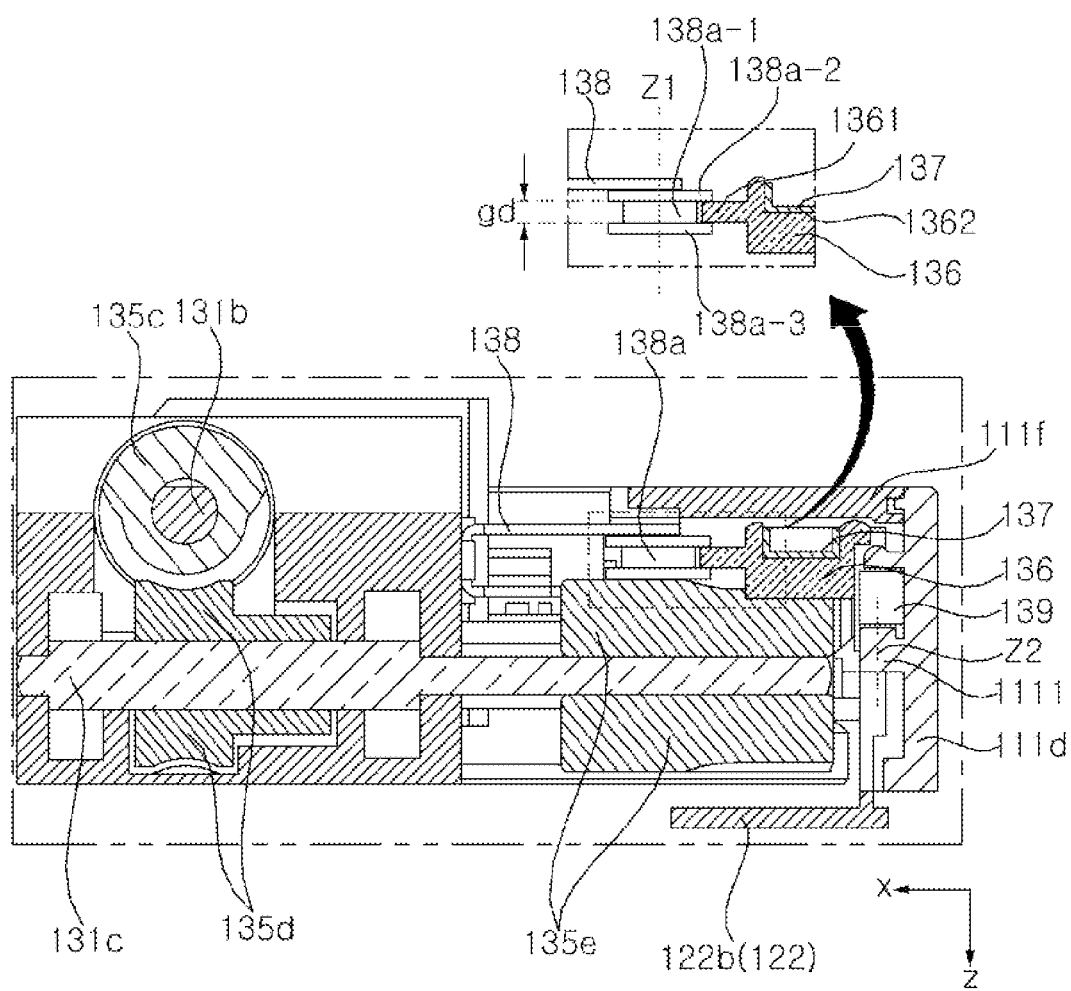

[FIG. 24]
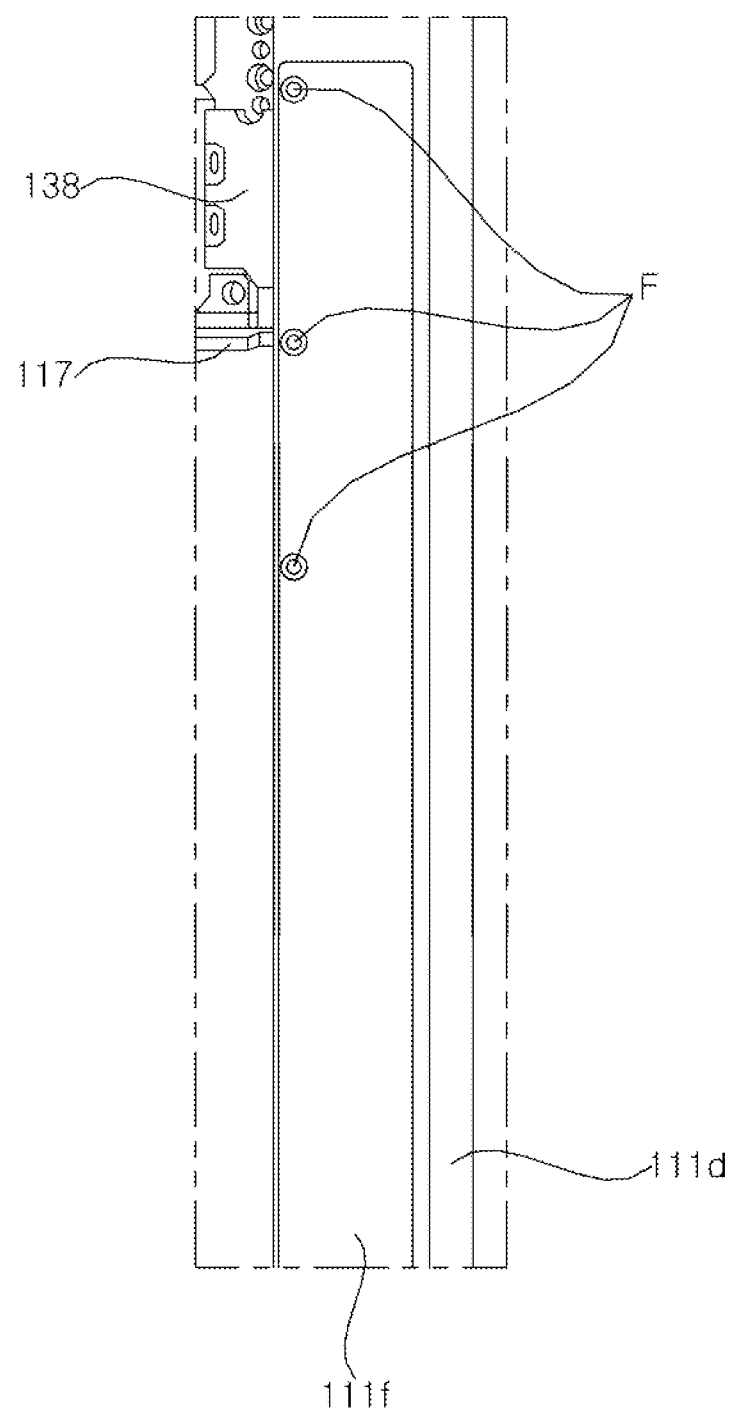

[FIG. 25]
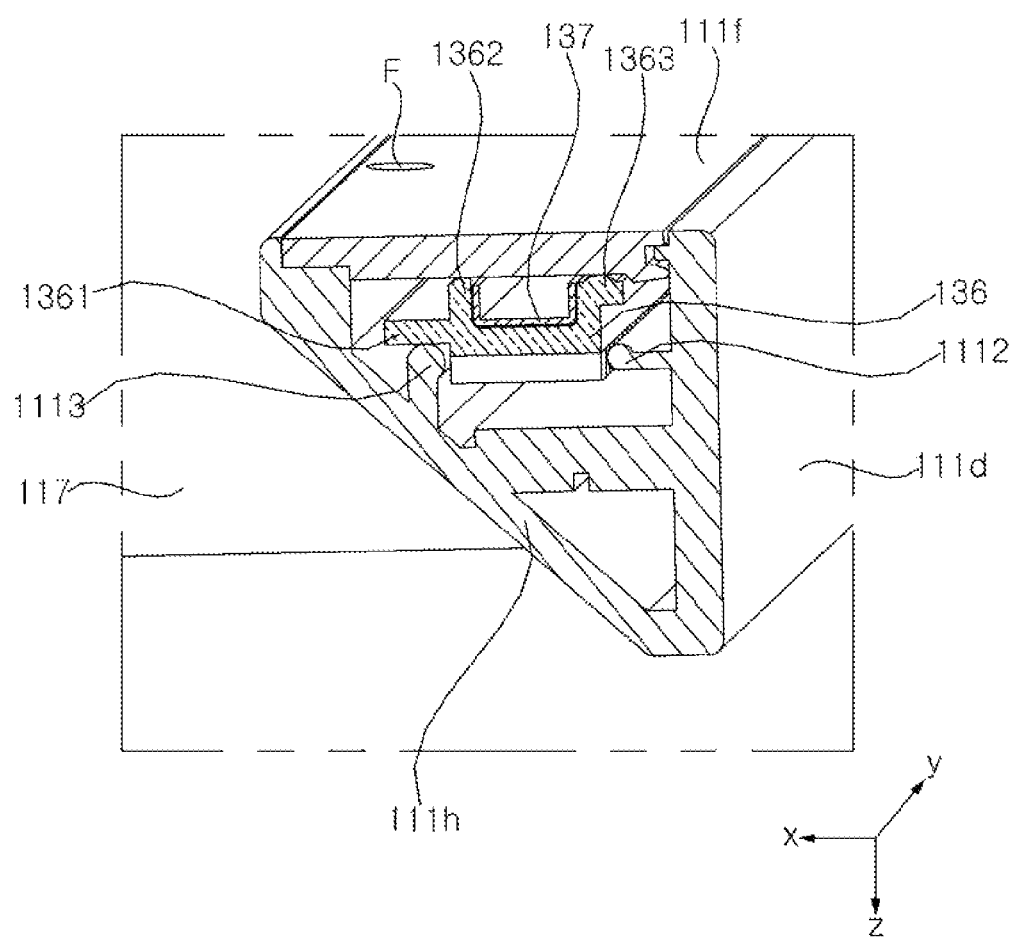

DISPLAY DEVICE

CROSS-REFERENCE TO RELATED APPLICATIONS

This application is the National Stage filing under 35 U.S.C. 371 of International Application No. PCT/KR2020/015704, filed on Nov. 10, 2020, the contents of which are all incorporated by reference herein in their entirety.

TECHNICAL FIELD

The present disclosure relates to a display device.

BACKGROUND ART

With the development of the information society, there have been growing demands for various types of display devices, and in order to meet these demands, various display devices, such as a liquid crystal display (LCD) device, a plasma display panel (PDP), an electroluminescent display (ELD), a vacuum fluorescent display (VFD), an organic light emitting diode (OLED), etc., have been studied and used recently.

Among them, the LCD panel includes a TFT substrate and a color substrate which are positioned opposite each other with a liquid crystal layer interposed therebetween, and displays images by using light emitted from a backlight unit. Further, the OLED panel may display images by using a self light-emitting organic layer deposited on a substrate on which transparent electrodes are formed.

Recently, a structure for covering a front surface of a display panel is being actively researched.

DISCLOSURE OF INVENTION

Technical Problem

It is an objective of the present disclosure to solve the above and other problems.

It is another objective of the present disclosure to provide a display device capable of covering or opening a front surface of a display panel.

It is further another objective of the present disclosure to provide a display device in which a gap between a display panel and a cover may be minimized.

It is yet another objective of the present disclosure to provide a mechanism capable of stably raising or lowering a cover that covers a front surface of a display panel.

It is yet another objective of the present disclosure to provide a structure capable of preventing a cover from moving back and forth and/or from side to side while the cover is raised or lowered.

Solution to Problem

According to an aspect of the present disclosure in order to achieve the above objectives, there is provided a display device including: a display panel; a frame to which the display panel is mounted; a cover assembly movably coupled to the frame and including a cover disposed at a front of the display panel; and a lift assembly mounted to the frame and moving the cover assembly, wherein the lift assembly includes: a motor providing rotational force; a pinion connected to a rotating shaft of the motor; and a rack engaged with the pinion and extending in a moving direction of the cover assembly, wherein the cover assembly includes a bracket coupled to the rack at a rear of the display panel.

Advantageous Effects of Invention

The display device according to the present disclosure has the following effects.

According to at least one of the embodiments of the present disclosure, a display device capable of covering or opening a front surface of a display panel may be provided.

According to at least one of the embodiments of the present disclosure, a display device may be provided in which a gap between a display panel and a cover may be minimized.

According to at least one of the embodiments of the present disclosure, a mechanism capable of stably raising or lowering a cover that covers a front surface of a display panel may be provided.

According to at least one of the embodiments of the present disclosure, a structure capable of preventing a cover from moving back and forth and/or from side to side while the cover is raised or lowered may be provided.

Further scope of applicability of the present disclosure will become apparent from the detailed description given hereinafter. However, it should be understood that the detailed description and specific examples, while indicating preferred embodiments of the present disclosure, are given by illustration only, since various changes and modifications within the spirit and scope of the present disclosure will become apparent to those skilled in the art from this detailed description.

BRIEF DESCRIPTION OF DRAWINGS

FIGS. 1 to 25 are diagrams illustrating examples of a display device according to embodiments of the present disclosure.

MODE FOR THE INVENTION

Hereinafter, the present disclosure will be described in detail with reference to the accompanying drawings, in which the same reference numerals are used throughout the drawings to designate the same or similar components, and a redundant description thereof will be omitted.

The suffixes, such as "module" and "unit," for elements used in the following description are given simply in view of the ease of the description, and do not have a distinguishing meaning or role.

In addition, it will be noted that a detailed description of known arts will be omitted if it is determined that the detailed description of the known arts can obscure the embodiments of the present disclosure. Further, the accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A singular representation may include a plural representation unless context clearly indicates otherwise.

In the following description, even if an embodiment is described with reference to a specific figure, reference numeral not appearing in the specific figure may be referred to if necessary, and reference numeral not appearing in the specific figure is used when the reference numeral appears in the other figures.

Referring to FIG. 1, a display device 100 may include a display panel 11. The display panel 11 may display images.

The display device 100 may include a first long side LS1, a second long side LS2 opposite to the first long side LS1, a first short side SS1 adjacent to the first long side LS1 and the second long side LS2, and a second short side SS2 opposite to the first short side SS1. For convenience of explanation, it is illustrated and described that the first and second long sides LS1 and LS2 are longer than the first and second short sides SS1 and SS2, but it is also possible that lengths of the first and second long sides LS1 and LS2 may be approximately equal to lengths of the first and second short sides SS1 and SS2.

A direction parallel to the long sides LS1 and LS2 of the display device 100 may be referred to as a first direction DR1 or a left-right direction LR. A direction parallel to the short sides SS1 and SS2 of the display device 1 may be referred to as a second direction DR2 or an up-down direction UD. A direction perpendicular to the long sides LS1 and LS2 and the short sides SS1 and SS2 of the display device 1 may be referred to as a third direction DR3 or a front-rear direction FR. Here, a side on which the display panel 11 displays an image may be referred to as a front side, and a side opposite thereto may be referred to as a rear side.

The first long side LS1 may be referred to as an upper side or an upper surface. The second long side LS2 may be referred to as a lower side or a lower surface. The first short side SS1 may be referred to as a left side or a left surface. The second short side SS2 may be referred to as a right side or a right surface.

The first long side LS1, the second long side LS2, the first short side SS1, and the second short side SS2 may be referred to as edges of the display device 100. Further, positions where the first long side LS1, the second long side LS2, the first short side SS1, and the second short side SS2 meet each other may be referred to as corners.

For example, a position where the first long side LS1 and the first short side SS1 meet each other may be referred to as a first corner C1. A position where the first short side SS1 and the second long side LS2 meet each other may be referred to as a second corner C2. A position where the second long side LS2 and the second short side SS2 meet each other may be referred to as a third corner C3. A position where the second short side SS2 and the first long side LS1 meet each other may be referred to as a fourth corner C4.

For example, the display panel 11 may be an OLED panel. The display panel 11 may divide an image into a plurality of pixels and may output the image while controlling color, brightness, and chroma of the respective pixels. The display panel 11 may be divided into an active area, in which the image is displayed, and a de-active area in which the image is not displayed. The display panel 11 may generate light corresponding to red, green, or blue color in response to a control signal. Meanwhile, the display panel 11 may be various panels such as LCD and the like.

Referring to FIGS. 1 and 2, a cover 20 may move up and down at the front of the display panel 11.

For example, while moving up, the cover 20 may cover at least partially a front surface of the display panel 11. While moving down, the cover 20 may expose the front surface of the display panel 11 to the outside.

In another example, while moving down, the cover 20 may cover at least partially the front surface of the display panel 11. While moving up, the cover 20 may expose the front surface of the display panel 11 to the outside.

Meanwhile, the cover 20 may include a metal or fabric material.

Referring to FIG. 3, the display device 100 may include a frame 110. The frame 110 may form the body of the display device 100. The frame 110 may include an outer frame 111, a guide frame 112, an upper frame 113, a middle frame 114, inner frames 115 and 116, and a lower frame 117.

The outer frame 111 may form a periphery of the frame 110, and may have a substantially square frame shape. The outer frame 111 may include a first outer frame 111a forming an upper end of the outer frame 111, a second outer frame 111b forming a lower end of the outer frame 111, a third outer frame 111c forming a left end of the outer frame 111, and a fourth outer frame 111d forming a right end of the outer frame 111.

The guide frame 112 may be disposed between the first outer frame 111a and the lower frame 117 and may be elongated in the up-down direction. The guide frame 112 may include a first guide frame 112a adjacent to the third outer frame 111c and a second guide frame 112b adjacent to the fourth outer frame 111d. The first guide frame 112a may be spaced rightwardly from the third outer frame 111c by a first gap ga. The second guide frame 112b may be spaced leftwardly from the fourth outer frame 111d by a second gap gb. For example, the second gap gb may be equal to the first gap ga.

The upper frame 113 may be disposed between the first guide frame 112a and the second guide frame 112b and may be elongated in the left-right direction. The upper frame 113 may be coupled to the first guide frame 112a and the second guide frame 112b.

The middle frame 114 may be disposed between the first outer frame 111a and the lower frame 117 and may be elongated in the up-down direction. The middle frame 114 may include a first middle frame 114a and a second middle frame 11b which are coupled to the first outer frame 111a and the lower frame 117 and are spaced apart from each other in the left-right direction.

The inner frames 115 and 116 may be disposed between the upper frame 113 and the lower frame 117 and may be elongated in the left-right direction. The inner frames 115 and 116 may include a pair of first inner frames 115a and 115b which are disposed between the first guide frame 112a and the first middle frame 114a, are coupled to the first guide frame 112a and the first middle frame 114a, and are spaced apart from each other in the up-down direction. The inner frames 115 and 116 may include a pair of second inner frames 116a and 116b which are disposed between the second guide frame 112b and the second middle frame 114b, are coupled to the second guide frame 112b and the second middle frame 114b, and are spaced apart from each other in the up-down direction.

The lower frame 117 may be disposed below the upper frame 113. The lower frame 117 may be disposed between the third outer frame 111c and the fourth outer frame 111d and may be elongated in the left-right direction. The lower frame 117 may be coupled to the third outer frame 111c and the fourth outer frame 111d.

Referring to FIG. 4, the display device 100 may include a cover assembly 120. The cover assembly 120 may include a cover frame 121 and a bracket 122.

The cover frame 121 may form a periphery of the cover assembly 120 and may have a substantially square frame shape. A first frame 121a of the cover frame 121 may extend in the left-right direction and may form an upper end of the cover frame 121. A second frame 121b of the cover frame 121 may extend in the left-right direction and may form a lower end of the cover frame 121. A third frame 121c of the cover frame 121 may extend in the up-down direction and may form a left end of the cover frame 121. A fourth frame 121d of the cover frame 121 may extend in the up-down direction and may form a right end of the cover frame 121.

The bracket 122 may be disposed between the upper end and the lower end of the cover frame 121 and may be coupled to a rear surface of the cover frame 121. The bracket 122 may be adjacent to the upper end, i.e., the first frame 121a, of the cover frame 121. The bracket 122 may include a first part 1221, a second part 1222, and a third part 1223.

The first part 1221 may form a front surface of the bracket 122 and may be fixed to a rear surface of the cover frame 121. The second part 1222 may be bent rearward from the first part 1221 and may from a side surface of the bracket 122. The third part 1223 may be bent leftward or rightward from the second part 1222 to face the first part 1221. The third part 1223 may be spaced rearwardly from the first part 1221 by a first length d1.

For example, the bracket 122 may include a first bracket 122a coupled to a rear surface of the third frame 121c, and a second bracket 122b coupled to a rear surface of the fourth frame 121d.

Referring to FIGS. 5 and 6, a lower hole 123 may be formed by passing through the second frame 121b in the front-rear direction. The lower hole 123 may have a shape formed by combining holes having different radii. That is, the lower hole 123 may be divided into a first hole 1231 having a first radius r1, and a second hole 1232 having a second radius r2. Here, the second radius r2 is smaller than the first radius r1, and the second hole 1232 may be combined with the first hole 1232 at the bottom of the first hole 1231. For example, the lower hole 123 may include a first lower hole 123a, a second lower hole 123b, and a third lower hole 123c which are spaced apart from each other in the left-right direction.

Aside hole 124 may be formed by passing through the third frame 121c and/or the fourth frame 121d in the front-rear direction. The side hole 124 may have a shape formed by combining holes having different radii. That is, the side hole 124 may be divided into a third hole 1241 having a third radius r3 and a fourth hole 1242 having a fourth radius r4. Here, the fourth radius r4 may be smaller than the third radius r3, and the fourth hole 1242 may be combined with the third hole 1241 at the bottom of the third hole 1241. For example, the side hole 124 may include a first side hole 124a formed in the third frame 121c, and a second side hole 124b formed in the fourth frame 121d.

Meanwhile, upper ends of the first bracket 122a and the second bracket 122b may be at a first height ha and lower ends thereof may be at a second height hb with respect to the bottom of the second frame 121b. In this case, heights of the first side hole 124a and the second side hole 124b with respect to the bottom of the second frame 121b may be smaller than the second height hb.

A holder 125 may include a body 1251 coupled to a rear surface of the first frame 121a. The body 1251 may have a substantially flat plate shape. An upper hole 1251a may be formed by passing through the body 1251 in the front-rear direction. The upper hole 1251a may have a shape formed by combining a circular hole, having a fifth radius r5, with a slit. Here, the slit may be elongated in the up-down direction at the top and bottom of the hole. Meanwhile, the holder 125 may be referred to as a latch.

A first gap 1251b may be spaced leftwardly from the upper hole 1251a and may be formed in an arc shape having a sixth radius r6. In this case, a portion 1252 of the body 1251 may be disposed between the upper hole 1251a and the first gap 1251b, may have elasticity, and may be referred to as a first gimbal or a first rib. A second gap 1251c may be spaced rightwardly from the upper hole 1251a and may be formed in an arc shape having the sixth radius r6. In this case, a portion 1253 of the body 1251 may be disposed between the upper hole 1251a and the second gap 1251c, may have elasticity, and may be referred to as a second gimbal or a second rib. For example, a fastening member including the upper hole 1251a, the first gap 1251b, and the second gap 1251c described above may be formed as a pair of fastening members which are spaced apart from each other in the left-right direction.

Meanwhile, a boss 1254 may protrude rearward from a rear surface of the body 1251 of the holder 125 to be inserted into a boss hole 121a-1 formed in the first frame 121a. Further, a fastening member Sr, such as a screw, may pass through the body 1251 of the holder 125 to be fastened to a fastening hole 121a-2 formed in the first frame 121a. For example, the holder 125 may include a first holder 125a, a second holder 125b, and a third holder 125c which are spaced apart from each other in the left-right direction.

Referring to FIG. 7, the cover assembly 120 may include a plate 126 having a front surface to which the cover 20 (see FIG. 2) is coupled. For example, a plurality of holes 126a, 126b, 126c, 126d, 126e, and 126f may be formed by passing through the plate 126 in the front-rear direction and may be spaced apart from each other.

A lower pin 127 may protrude rearward from a rear surface of the plate 126. The lower pin 127 may be adjacent to a lower end of the plate 126. The lower pin 127 may include a lower head 1271 having a predetermined radius r10, and a lower neck 1272 coupled to the lower head 1271 and the plate 126 at a position between the lower head 1271 and the plate 126. In this case, a radius of the lower neck 1272 may be smaller than a radius of the lower head 1271. For example, the lower pin 127 may include a first lower pin 127a, a second lower pin 127b, and a third lower pin 127c which are spaced apart from each other in the left-right direction.

A side pin 128 may protrude rearward from the rear surface of the plate 126. The side pin 128 may be adjacent to a left end or a right end of the plate 126. The side pin 128 may include a side head 1281 having a predetermined radius r20, and a side neck 1282 coupled to the side head 1281 and the plate 126 at a position between the side head 1281 and the plate 126. In this case, a radius of the side neck 1282 may be smaller than a radius of the side head 1281. For example, the side pin 128 may include a first side pin 128a adjacent to the left end of the plate 126, and a second side pin 128b adjacent to the right end of the plate 126.

A pair of upper pins 129 may be provided which protrude rearward from the rear surface of the plate 126 and are spaced apart from each other. The upper pin 129 may be adjacent to the upper end of the plate 126. The upper pin 129 may include an upper head 1291 having a predetermined radius r30, and an upper neck 1292 coupled to the upper head 1291 and the plate 126 at a position between the upper head 1291 and the plate 126. In this case, a radius of the upper neck 1292 may be smaller than a radius of the upper head 1291. For example, the upper pin 129 may include a first upper pin 129a, a second upper pin 129b, and a third upper pin 129c which are spaced apart from each other in the left-right direction.

Referring to FIGS. 8 and 9, the plate 126 may be detachably coupled to the cover frame 121 at the front of the cover frame 121.

The radius r10 (see FIG. 7) of the lower head 1271 may be smaller than or equal to the first radius r1 (see FIG. 5) of the first hole 1231. Further, the radius r10 of the lower head 1271 may be greater than the second radius r2 (see FIG. 5) of the second hole 1232. That is, after a user and the like passes the lower head 1271 through the first hole 1231, the lower head 1271 may move down to be seated on a rear surface of the second frame 121b forming a boundary of the second hole 1232. In addition, a lower end of the plate 126 may be seated on a front surface of the second frame 121b forming the boundary of the second hole 1232. In this manner, movement of the lower pin 127 in the front-rear direction may be restricted.

The radius r20 (see FIG. 7) of the side head 1281 may be smaller than or equal to the third radius r3 (see FIG. 5) of the third hole 1241. Further, the radius r20 of the side head 1281 may be greater than the fourth radius r4 (see FIG. 5) of the fourth hole 1242. That is, after a user and the like passes the side head 1281 through the third hole 1241, the side head 1281 may move down to be seated on a rear surface of the third frame 121c or the fourth frame 121d that forms a boundary of the fourth hole 1242.

The radius r30 (see FIG. 7) of the upper head 1291 may be greater than the fifth radius r5 (see FIG. 5) of the upper hole 1251a, but smaller than the sixth radius r6 (see FIG. 5) of the first gap 1251b or the second gap 1251c. That is, after a user and the like passes the upper head 1291 through the upper hole 1251a while spreading a first gimbal 1252 and a second gimbal 1253 from side to side, the upper head 1291 may be seated on the rear surface of the body 1251.

Meanwhile, the plate 126 and the cover frame 121 may be coupled to each other by coupling between the lower pin 127 and the lower hole 123, coupling between the side pin 128 and the side hole 124, and coupling between the upper pin 129 and the upper hole 1251a in temporal order. In this case, the upper pin 129 and the upper hole 1251a may be coupled to each other in such a manner that while the plate 126 is bent forward from the body 1251 of the holder 125, the upper head 1291 is inserted into the upper hole 1251a.

Referring to FIG. 10, an upper end 1211 of the first frame 121a may protrude forward from the first frame 121a by a predetermined distance 110. In this case, an upper end of the plate 126 may be disposed below the upper end 1211 of the first frame 121a with a predetermined gap g10 therebetween.

For example, an end of the cover 20 (see FIG. 2) may pass between the upper end of the plate 126 and the upper end 1211 of the first frame 121a to be fixed between the plate 126 and the first frame 121a.

Referring to FIG. 11, an upper end 1261 of the plate 126 may protrude rearward from the plate 126 by a predetermined length 120. In this case, the upper end of the first frame 121a may be disposed below the upper end 1261 of the plate 126 with a predetermined gap g20 therebetween.

For example, the cover 20 (see FIG. 20) may be attached to the front surface of the plate 126. To this end, an adhesive material, such as a double-sided tape and the like, may be provided between the cover 20 and the plate 126.

Referring to FIGS. 12 and 13, a display part 10 may include the display panel 11 and the frame 13. Here, the frame 13 may be coupled to the display panel 11 at the rear of the display panel 11. For example, electronic components, electrically connected to the display panel 11, may be mounted in the frame 13. Meanwhile, the frame 13 may be referred to as a main frame, an inner frame, or a module cover.

A front surface of the display part 10 may be spaced rearwardly from the plate 126. Accordingly, the cover 20 (see FIG. 2) coupled to the front surface of the plate 126 may cover at least partially the front surface of the display panel 11.

The display part 10 may be installed in a space partitioned by the first outer frame 11a, the first guide frame 112a, the upper frame 113, and the second guide frame 112b. In this case, the upper frame 113 may be coupled to the display part 10 at the bottom of the display part 10 to support the load of the display part 10. Further, the display panel 11 may have a total height of h1.

When the cover assembly 120 is disposed at the lower side of the display part 10, the entire front surface of the display panel 11 may be exposed forwardly.

Referring to FIGS. 13 to 15, a lift assembly 130 may be mounted on the lower frame 117. Here, FIG. 14 is an enlarged view of region M of FIG. 13. For example, the lift assembly 130 may include a first lift assembly 130a, located relatively on the left and a second lift assembly 130b located relatively on the right. The following description will be given based on the second lift assembly 130b for brief explanation, and the description thereof may also be applied to the first lift assembly 130a.

The lift assembly 130 may include a motor 131, a gear box 135 with a plurality of gears mounted therein, a pinion 135e, and a rack 136. In this case, the gear box 135 may be mounted on the lower frame 117.

The motor 131 may provide rotational force. For example, the motor 131 may be an electric motor capable of adjusting a rotation direction and a rotation speed. The motor 131 may be mounted on a motor mount 132. For example, the motor 131 may be disposed above the gear box 135. A rotating shaft 131a of the motor 131 may extend in the up-down direction, and a portion thereof may be inserted into the gear box 135. Meanwhile, an encoder 134 may be installed on one side of the motor 131 to control rotation of the motor 131.

The gear box 135 may include a first gear 135a, a second gear 135b, a worm 135c, and a worm wheel 135d. The first gear 135a may be fixed to the rotating shaft 131a of the motor 131 to rotate together with the rotating shaft 131a. The second gear 135b may be engaged with the first gear 135a and may be fixed to a first shaft 131b. Here, the first shaft 131b may be spaced apart from the rotating shaft 131a and may extend in the up-down direction. The worm 135c may be spaced apart from the second gear 135b and may be fixed to the first shaft 131b. The worm wheel 135d may be engaged with the worm 135c and may be fixed to a second shaft 131c. Here, the second shaft 131c may be spaced apart from the rotating shaft 131a and the first shaft 131b and may extend in the left-right direction. Accordingly, power of the motor 131 may be transmitted from the first gear 135a, which is fixed to the rotating shaft 131a, to the second shaft 131c through the second gear 135b, the worm 135c, and the worm wheel 135d.

The pinion 135e may be fixed to the second shaft 131c to rotate together with the second shaft 131c. The rack 136 may be engaged with the pinion 135e and may be elongated in the up-down direction. That is, the rack 136 may move up and down when the pinion 135e is rotated.

Meanwhile, the rack 136 may be coupled to the third part 1223 of the bracket 122. For example, a fastening member (not shown), such as a screw, may pass through the hole 1224, formed in the third part 1223, to be fastened to the rack 136.

Accordingly, when the motor 131 is driven, the cover assembly 120 (see FIG. 8) including the bracket 122 may move up and down. Further, while the cover 20 (see FIG. 2) is disposed at the front of the display part 10, the lift assembly 130 and the bracket 122 coupled thereto are disposed at the rear of the display part 10, such that a gap between the display panel 11 and the cover 20 may be minimized.

Referring to FIGS. 16 and 17, a pad 133 may be adjacent to the motor 131 and may be fixed to the guide frame 112. Bosses 1121a, 1121b, and 1121c may protrude rearward from a rear surface of the guide frame 112 to be coupled to the pad 133. For example, the pad 133 may include a first pad 113a, a second pad 113b, and a third pad 133c which are spaced apart from each other in the up-down direction. In this case, a first boss 1121a may be inserted into the first pad 133a, a second boss 1121b may be inserted into the second pad 113b, and a third boss 1121c may be inserted into the third pad 133c. Further, the pad 133 may have a side surface with a groove formed therein.

In this case, a flange 132a may protrude from a side surface of the mount 132 to be inserted into the groove of the pad 133. In other words, the pad 133 may be inserted into the bosses 1121a, 1121b, and 1121c of the guide frame 112 and the flange 132a of the mount 132. Further, the pad 133 may include an elastic material such as rubber or silicone.

Accordingly, the pad 133 may reduce noise or vibration occurring while the motor 131 is driven.

Referring to FIGS. 18 and 19, the cover assembly 120 may partially cover the front surface of the display panel 11. For example, on the front surface of the display panel 11, a region corresponding to the second height h2 above the bottom of the display panel 11 may be covered by the cover assembly 120. For example, on the front surface of the display panel 11, a region corresponding to a third height h3 below the top of the display panel 11 may be exposed forwardly. In this case, a sum of the second height h2 and the third height h3 equals the total height h1 of the display panel 11.

Referring to FIGS. 19 to 21, the bracket 122 may move upward together with the rack 136 to move away from the lower frame 117. Here, FIG. 20 is an enlarged view of region N of FIG. 19.

When the aforementioned motor 131 is driven such that the pinion 135e is rotated in a first rotation direction, the rack 136 and the bracket 122 coupled thereto may move upward along the guide frame 112. When the aforementioned motor 131 is driven such that the pinion 135e is rotated in a second rotation direction opposite the first rotation direction, the rack 136 and the bracket 122 coupled thereto may move downward along the guide frame 112. In this case, a moving distance of the bracket 112 may be adjusted by controlling the rotation of the motor 131. For example, the motor 131 may be a step motor.

Meanwhile, the movement of the bracket 122 may be the same as the movement of the cover assembly 120 including the bracket 122.

Referring to FIGS. 17 and 22, a rail 118 may be mounted on the guide frame 112 and may be disposed between the first part 1121 and the third part 1223 of the bracket 122. The rail 118 may be elongated in the up-down direction to guide the movement of the bracket 122.

The rail 118 may include a first flange 1181, a web 1182, and a second flange 1183. The first flange 1181 may form a rear surface of the rail 118, and the second flange 1183 may form a front surface of the rail 118 and may be fixed to the guide frame 112. The web 1182 may be coupled to the first flange 1181 and the second flange 1183 at a position between the first flange 1181 and the second flange 1183. For example, the first flange 1181 and the second flange 1183 may have the same width, and the web 1182 may have a width smaller than the width of the first flange 1181. The rail 118 may have a substantially H-beam or I-beam shape.

A guide 1224 may be fixed to the front surface of the third part 1223 and may be coupled to the rail 118 to slide along the rail 118. Specifically, the guide 1224 may have an end surrounding the first flange 1181 at the front of the rail 118 and disposed adjacent to the web 1182. That is, while being coupled to the first flange 1181, the guide 1224 may move up and down along the rail 118. Meanwhile, protective materials 1225 and 1226 may be disposed on the first flange 1181 and the guide 1224, thereby preventing damage to the rail 118 and/or the guide 1224 which is caused by the movement of the guide 1224 along the rail 118. For example, the protective materials 1225 and 1226 may be made of a material different from a material of the rail 118 and the guide 1224.

Referring to FIGS. 21 and 23, the pinion 135e may be engaged with the rack 136 at the front of the rack 136. A body (not numbered) of the rack 136 may have a gear formed therein which is engaged with the pinion 135e, and may include a recessed portion 1362 recessed from the body toward the pinion 135e.

In this case, a supporter 137 may be inserted into the recessed portion 1362. For example, the supporter 137 may be made of a material different from the body. For example, the body may include a plastic material, and the supporter 137 may include a metal material such as aluminum (Al). Accordingly, the supporter 137 may improve torsional stiffness and/or bending stiffness.

Meanwhile, a base 138 may be fixed to a side surface of the gear box 135. Pulleys 138a and 138b may be rotatably coupled to the base 138. A rotation axis Z1 of the pulleys 138a and 138b may be parallel to the front-rear direction. For example, the pulleys 138a and 138b may include a first pulley 138a and a second pulley 138b which are spaced apart from each other in the up-down direction. In this case, a rib 1361 may protrude from a side surface of the rack 136 that is adjacent to the pulleys 138a and 138b and may be inserted into the pulleys 138a and 138b so as to be movable in the up-down direction.

Further, the pulleys 138a and 138b may include a first part 138a-1, a second part 138a-2, and a third part 138a-3. The first part 138a-1 may contact a side surface of the rib 1361 at a position between the second part 138a-2 and the third part 138a-3. The second part 138a-2 may contact a rear surface of the rib 1361. The third part 138a-3 may contact a front surface of the rib 1361. In this case, a gap gd between the second part 138a-2 and the third part 138a-3 may be equal to or greater than a thickness of the rib 1361. Accordingly, the pulleys 138a and 138b may limit back-and-forth movement and/or a leftward movement while guiding up-and-down movement of the rib 1361 and the rack 136 coupled thereto.

Meanwhile, a roller 139 may contact a side surface opposite the side surface of the rack 136 that is adjacent to the pulleys 138*a* and 138*b*. The roller 139 may be rotatably coupled to a protrusion 1111 protruding from an inner surface of the fourth outer frame 111*d* toward the pinion 135*e*. A rotation axis Z2 of the roller 139 may be parallel to the front-rear direction. Accordingly, the roller 139 may limit rightward movement of the rack 136.

Referring to FIGS. 24 and 25, a front frame 111*h* may be bent from a front end of the fourth outer frame 111*d* and may be inclined at an acute angle with respect to the fourth outer frame 111*d*. Meanwhile, the fourth outer frame 111*d* may form a right side of the frame 111 and may be referred to as a side frame. A rear frame 111*f* may be coupled to a rear end of the fourth outer frame 111*d* and a rear end of the front frame 111*h*. The rear frame 111*f* may be disposed at the rear of the rack 136. For example, a fastening member, such as a screw, may pass through a hole F of the rear frame 111*f* to be fastened to the rear end of the front frame 111*h*. For example, the front frame 111*h* and the rear frame 111*f* may extend in the up-down direction, and a portion disposed at an upper side of the lower frame 117 may be longer than a portion disposed at a lower side thereof.

In this case, the fourth outer frame 111*d*, the front frame 111*h*, and the rear frame 111*f* may divide an internal space in which the rack 136 is movable. Meanwhile, the third outer frame 111*e* may also include the front frame 111*h* and the rear frame 111*f* which are described above and will be described below.

A first protrusion 1112 may protrude from an inner surface of the fourth outer frame 111*d* toward the rack 136. The first protrusion 1112 may make line contact with the rack 136. For example, as part of the first protrusion 1112, a portion in contact with the rack 136 may be curved or may be formed as an edge.

A second protrusion 1113 may protrude from an inner surface of the front frame 111*h* toward the rib 1361. The second protrusion 1113 may make line contact with the rib 1361. For example, as part of the second protrusion 1113, a portion in contact with the rib 1361 may be curved or may be formed as an edge.

Third protrusions 1362 and 1363 may protrude rearward from a rear surface of the rack 136 and may make line contact with the rear frame 111*f*. For example, as part of the third protrusions 1362 and 1363, a portion in contact with the rear frame 111*f* may be curved or may be formed as an edge.

Accordingly, the first protrusion 1112 may limit rightward movement of the rack 136, a second protrusion 1113 may limit forward movement of the rack 136, and the rear frame 111*f* may limit rearward movement of the rack 136. Further, the contact between the first protrusion 1112 and the rack 136, the contact between the second protrusion 1113 and the rib 1361, and the contact between the third protrusions 1362 and 1363 and the rear frame 111*f* are line contacts, such that resistance caused by the contacts between the members is minimized, thereby allowing smooth up-and-down movement of the rack 136.

According to an embodiment of the present disclosure, there is provided a display device including: a display panel; a frame to which the display panel is mounted; a cover assembly movably coupled to the frame and including a cover disposed at a front of the display panel; and a lift assembly mounted to the frame and moving the cover assembly, wherein the lift assembly includes: a motor providing rotational force; a pinion connected to a rotating shaft of the motor; and a rack engaged with the pinion and extending in a moving direction of the cover assembly, wherein the cover assembly includes a bracket coupled to the rack at a rear of the display panel.

In addition, according to another embodiment of the present disclosure, the lift assembly may further include a pair of lift assemblies which are spaced apart from each other in a left-right direction.

In addition, according to another embodiment of the present disclosure, the cover assembly may further include a plate coupled to the cover at a rear of the cover, wherein the bracket may further include: a first part coupled to the plate at a rear of the plate; a second part bent rearward from the first part; and a third part bent leftward or rightward from the second part to face the first part, wherein the third part may be disposed at the rear of the display panel and may be coupled to the rack.

In addition, according to another embodiment of the present disclosure, the display device may further include a rail mounted on the frame, disposed between the first part and the third part, and extending in a moving direction of the cover assembly, wherein the bracket may further include a guide fixed to a front surface of the third part and coupled to the rail to move along the rail.

In addition, according to another embodiment of the present disclosure, the rack may further include: a body having a gear formed therein which is engaged with the pinion, the body including a recessed portion recessed from the body toward the pinion; and a supporter inserted into the recessed portion and made of a material different from the body.

In addition, according to another embodiment of the present disclosure, the display device may further include a pulley adjacent to a side surface of the rack and rotatable about an axis parallel to a front-rear direction, wherein the rack may further include a rib protruding from the side surface of the rack that is adjacent to the pulley, and inserted into the pulley so as to be movable in an up-down direction.

In addition, according to another embodiment of the present disclosure, the pulley may further include: a first part contacting a side surface of the rib; a second part contacting a rear surface of the rib; and a third part contacting a front surface of the rib, wherein a gap between the second part and the third part may be equal to or greater than a thickness of the rib.

In addition, according to another embodiment of the present disclosure, the display device may further include a roller contacting a side surface opposite the side surface of the rack that is adjacent to the pulley, and rotatable about the axis parallel to the front-rear direction.

In addition, according to another embodiment of the present disclosure, the frame may further include: a side frame forming a side surface of the frame; a front frame bent from a front end of the side frame and inclined at an acute angle with respect to the side frame; and a rear frame coupled to a rear end of the side frame and a rear end of the front frame, wherein the side frame, the front frame, and the rear frame may divide an internal space in which the rack is movable.

In addition, according to another embodiment of the present disclosure, the side frame may further include a first protrusion protruding from an inner surface of the side frame toward the rack, wherein an outer surface of the first protrusion may make line contact with the rack.

In addition, according to another embodiment of the present disclosure, the front frame may further include a second protrusion protruding from an inner surface of the front frame toward the rib, wherein an outer surface of the second protrusion may make line contact with the rib.

In addition, according to another embodiment of the present disclosure, the rear frame may be disposed at a rear of the rack, wherein the rack may further include a third protrusion protruding rearward from a rear surface of the rack and making line contact with the rear frame.

In addition, according to another embodiment of the present disclosure, the display device may further include a pad adjacent to the motor and having a side surface with a groove formed therein, wherein the lift assembly may further include: a mount on which the motor is mounted; and a flange protruding from the mount and inserted into the groove, wherein the frame may further include a guide frame having a boss coupled to the pad.

In addition, according to another embodiment of the present disclosure, wherein the lift assembly may further include a gear box accommodating a plurality of gears connected to the rotating shaft of the motor and the pinion, wherein the frame may further include a lower frame which extends in the left-right direction and on which the gear box is mounted.

In addition, according to another embodiment of the present disclosure, the cover may gradually cover the front surface of the display panel while moving up, or may gradually expose the front surface of the display panel while moving down.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device comprising:
a display panel;
a frame to which the display panel is mounted;
a cover assembly movably coupled to the frame and including a cover disposed at a front of the display panel; and
a lift assembly mounted to the frame and moving the cover assembly,
wherein the lift assembly comprises:
a motor providing rotational force;
a pinion connected to a rotating shaft of the motor; and
a rack engaged with the pinion and extending in a moving direction of the cover assembly,
wherein the rack is disposed at a rear of the display panel,
wherein the cover assembly comprises a bracket covering a lateral side of the display panel, and
wherein the bracket connects the cover and the rack.

2. The display device of claim 1, wherein the lift assembly further comprises a pair of lift assemblies which are spaced apart from each other in a left-right direction.

3. The display device of claim 1, wherein the cover assembly further comprises a plate coupled to the cover at a rear of the cover,
wherein the bracket further comprises:
a first part coupled to the plate at a rear of the plate;
a second part bent rearward from the first part; and
a third part bent leftward or rightward from the second part to face the first part,
wherein the third part is disposed at the rear of the display panel and is coupled to the rack.

4. The display device of claim 3, further comprising:
a rail mounted on the frame, disposed between the first part and the third part, and extending in a moving direction of the cover assembly,
wherein the bracket further comprises a guide fixed to a front surface of the third part and coupled to the rail to move along the rail.

5. The display device of claim 1, wherein the rack further comprises:
a body having a gear formed therein which is engaged with the pinion, the body including a recessed portion recessed from the body toward the pinion; and
a supporter inserted into the recessed portion and made of a material different from the body.

6. The display device of claim 1, wherein the lift assembly further comprises a gear box accommodating a plurality of gears connected to the rotating shaft of the motor and the pinion,
wherein the frame further comprises a lower frame which extends in a left-right direction and on which the gear box is mounted.

7. The display device of claim 1, wherein the cover gradually covers the front surface of the display panel while moving up, or gradually exposes the front surface of the display panel to an outside while moving down.

8. A display device comprising:
a display panel;
a frame to which the display panel is mounted;
a cover assembly movably coupled to the frame and including a cover disposed at a front of the display panel;
a lift assembly mounted to the frame and moving the cover assembly; and
a pulley rotatable about an axis parallel to a front-rear direction,
wherein the lift assembly comprises:
a motor providing rotational force;
a pinion connected to a rotating shaft of the motor; and
a rack engaged with the pinion and extending in a moving direction of the cover assembly,
wherein the cover assembly comprises a bracket coupled to the rack at a rear of the display panel,
wherein the pulley is adjacent to a side surface of the rack, and
wherein the rack further comprises a rib protruding from the side surface of the rack that is adjacent to the pulley, and inserted into the pulley so as to be movable in an up-down direction.

9. The display device of claim 8, wherein the pulley further comprises:
- a first part contacting a side surface of the rib;
- a second part contacting a rear surface of the rib; and
- a third part contacting a front surface of the rib,
- wherein a gap between the second part and the third part is equal to or greater than a thickness of the rib.

10. The display device of claim 8, further comprising a roller contacting a side surface opposite the side surface of the rack that is adjacent to the pulley, and rotatable about the axis parallel to the front-rear direction.

11. The display device of claim 8, wherein the frame further comprises:
- a side frame forming a side surface of the frame;
- a front frame bent from a front end of the side frame and inclined at an acute angle with respect to the side frame; and
- a rear frame coupled to a rear end of the side frame and a rear end of the front frame,
- wherein the side frame, the front frame, and the rear frame divide an internal space in which the rack is movable.

12. The display device of claim 11, wherein the side frame further comprises a first protrusion protruding from an inner surface of the side frame toward the rack,
- wherein an outer surface of the first protrusion makes line contact with the rack.

13. The display device of claim 11, wherein the front frame further comprises a second protrusion protruding from an inner surface of the front frame toward the rib,
- wherein an outer surface of the second protrusion makes line contact with the rib.

14. The display device of claim 11, wherein the rear frame is disposed at a rear of the rack,
- wherein the rack further comprises a third protrusion protruding rearward from a rear surface of the rack and making line contact with the rear frame.

15. A display device comprising:
- a display panel;
- a frame to which the display panel is mounted;
- a cover assembly movably coupled to the frame and including a cover disposed at a front of the display panel;
- a lift assembly mounted to the frame and moving the cover assembly; and
- a pad having a side surface with a groove formed therein,
- wherein the lift assembly comprises:
- a motor providing rotational force;
- a pinion connected to a rotating shaft of the motor;
- a rack engaged with the pinion and extending in a moving direction of the cover assembly:
- a mount on which the motor is mounted; and
- a flange protruding from the mount and inserted into the groove,
- wherein the cover assembly comprises a bracket coupled to the rack at a rear of the display panel,
- wherein the pad is adjacent to the motor, and
- wherein the frame further comprises a guide frame having a boss coupled to the pad.

* * * * *